US012772731B2

(12) United States Patent
Lee et al.

(10) Patent No.: US 12,772,731 B2
(45) Date of Patent: Oct. 20, 2026

(54) ORGANIC LIGHT EMITTING DIODE AND ORGANIC LIGHT EMITTING DISPLAY DEVICE INCLUDING THE SAME

(71) Applicant: LG Display Co., Ltd., Seoul (KR)

(72) Inventors: Ji-Ae Lee, Paju-si (KR); Young-Ju Ryu, Paju-si (KR); Gi-Hwan Lim, Paju-si (KR); Jun-Yun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 921 days.

(21) Appl. No.: 18/072,309

(22) Filed: Nov. 30, 2022

(65) Prior Publication Data

US 2023/0189628 A1 Jun. 15, 2023

(30) Foreign Application Priority Data

Dec. 14, 2021 (KR) ........................ 10-2021-0178379

(51) Int. Cl.
*H10K 85/60* (2023.01)
*C07F 5/02* (2006.01)
(Continued)

(52) U.S. Cl.
CPC ........... *H10K 85/658* (2023.02); *C07F 5/027* (2013.01); *C09K 11/06* (2013.01); (Continued)

(58) Field of Classification Search
CPC .................................................... H10K 85/658
See application file for complete search history.

(56) References Cited

U.S. PATENT DOCUMENTS 8,643,268 B2 2/2014 Ogiwara et al.
2017/0237021 A1* 8/2017 Masahiro ................ C07F 15/00 546/4

(Continued)

FOREIGN PATENT DOCUMENTS

KR 10-1650996 B1 8/2016
KR 10-2020-0118399 A 10/2020

(Continued)

OTHER PUBLICATIONS

Lee et al. "Highly efficient inverted top emitting organic light emitting diodes using a horizontally oriented green phosphorescent emitter", Organic Electronics vol. 15, Issue Nov. 11, 2014, pp. 2715-2718 (Year: 2014).*

(Continued)

*Primary Examiner* — Chanceity N Robinson
(74) *Attorney, Agent, or Firm* — Birch, Stewart, Kolasch & Birch, LLP

(57) ABSTRACT

An organic light emitting diode is described, which includes a reflective electrode, a transparent electrode facing the reflective electrode, and an organic light emitting layer. The organic light emitting layer includes a first emitting part and a second emitting part, and is positioned between the reflective electrode and the transparent electrode. The first emitting part includes a phosphorescent emitting layer and a fluorescent emitting layer, and the second emitting part includes a phosphorescent emitting layer and a fluorescent emitting layer. In at least one of the first and second emitting parts, the fluorescent emitting layer is positioned to be closer to the transparent electrode than the phosphorescent emitting layer. An organic light emitting device can include the organic light emitting diode, and may be a display device or a lighting device.

23 Claims, 8 Drawing Sheets

(51) Int. Cl.

| | |
|---|---|
| ***C09K 11/06*** | (2006.01) |
| ***H10K 50/11*** | (2023.01) |
| ***H10K 59/12*** | (2023.01) |
| ***H10K 59/35*** | (2023.01) |
| ***H10K 101/10*** | (2023.01) |

(52) U.S. Cl.
CPC ...... *C09K 2211/1018* (2013.01); *H10K 50/11* (2023.02); *H10K 59/12* (2023.02); *H10K 59/35* (2023.02); *H10K 2101/10* (2023.02)

(56) References Cited

U.S. PATENT DOCUMENTS

| | | | | |
|---|---|---|---|---|
| 2020/0066997 | A1 | 2/2020 | Huang et al. | |
| 2020/0203652 | A1* | 6/2020 | Duan | H10K 85/631 |
| 2021/0119141 | A1 | 4/2021 | Hong et al. | |

FOREIGN PATENT DOCUMENTS

| | | | | |
|---|---|---|---|---|
| KR | 20200118399 | A * | 10/2020 | H10K 50/11 |
| KR | 10-2021-0050537 | A | 5/2021 | |
| WO | WO-2018095397 | A1 * | 5/2018 | C07F 5/027 |
| WO | WO 2020/042626 | A1 | 3/2020 | |

OTHER PUBLICATIONS

English Machine Translatio of Abstract of KR20200118399 A (Year: 2026).*

* cited by examiner

ORGANIC LIGHT EMITTING DIODE AND ORGANIC LIGHT EMITTING DISPLAY DEVICE INCLUDING THE SAME

CROSS-REFERENCE TO RELATED APPLICATIONS

The present application claims priority to Korean Patent Application No. 10-2021-0178379 filed in the Republic of Korea on Dec. 14, 2021, which is hereby incorporated by reference in its entirety into the present specification.

BACKGROUND

Technical Field

The present disclosure relates to an organic light emitting diode, and more particularly, to an organic light emitting diode having high display performance and an organic light emitting device including the organic light emitting diode.

Discussion of the Related Art

As display devices have become larger, there exists a desire to have a flat panel display device that takes up less space. Among the flat panel display devices, the use of an organic light emitting display device that includes an organic light emitting diode (OLED), such as an organic electroluminescent device, is rapidly developing.

The OLED emits light by injecting electrons from a cathode as an electron injection electrode, as well as holes from an anode as a hole injection electrode into an emitting material layer, combining the electrons with the holes, generating an exciton, and transforming the exciton from an excited state to a ground state.

Luminescent materials such as fluorescent materials have been used as emitters in the OLED. However, since only a singlet exciton of the fluorescent material is involved in the emission, the emitting efficiency of the fluorescent material is limited, and there is a problem of low luminous efficiency.

SUMMARY OF THE DISCLOSURE

Embodiments of the present disclosure are directed to an OLED and an organic light emitting device that address one or more of the problems and disadvantages of the related art.

In particular, an object of the present disclosure is to provide an OLED and an organic light emitting device having high display performance.

Additional features and aspects will be set forth in the description that follows, and in part will be apparent from the description, or can be learned by practice of the present disclosure and concepts provided herein. Other features and aspects of the present disclosure concepts can be realized and attained by the structure particularly pointed out in the written description, or derivable therefrom, and the claims hereof as well as the appended drawings.

As described herein, an aspect of the present disclosure is an organic light emitting diode including a reflective electrode; a transparent electrode facing the reflective electrode; and an organic light emitting layer including a first emitting part and a second emitting part, which are positioned between the reflective electrode and the transparent electrode. The first emitting part includes a first phosphorescent emitting layer and a first fluorescent emitting layer, while the second emitting part includes a second phosphorescent emitting layer and a second fluorescent emitting layer. The first phosphorescent emitting layer includes a first compound and a second compound, and the first fluorescent emitting layer includes a third compound, a fourth compound and a fifth compound, wherein the second fluorescent emitting layer includes a sixth compound, a seventh compound and an eighth compound, and the second phosphorescent emitting layer includes a ninth compound and a tenth compound. Each of the second compound and the tenth compound is represented by Formula 3:

[Formula 3]

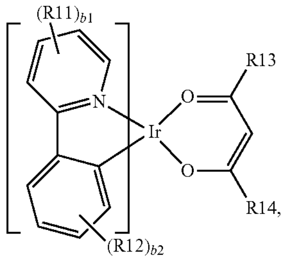

wherein in Formula 3, each of R11 and R12 is independently selected from the group consisting of halogen, a substituted or unsubstituted C1 to C10 alkyl group, a substituted or unsubstituted C6 to C30 aryl group and a substituted or unsubstituted C5 to C30 heteroaryl group, and each of b1 and b2 is independently an integer of 0 to 4, wherein each of R13 and R14 is independently selected from the group consisting of hydrogen, halogen, a substituted or unsubstituted C1 to C10 alkyl group, a substituted or unsubstituted C6 to C30 aryl group and a substituted or unsubstituted C5 to C30 heteroaryl group, wherein each of the fifth compound and the eighth compound is represented by Formula 7:

[Formula 7]

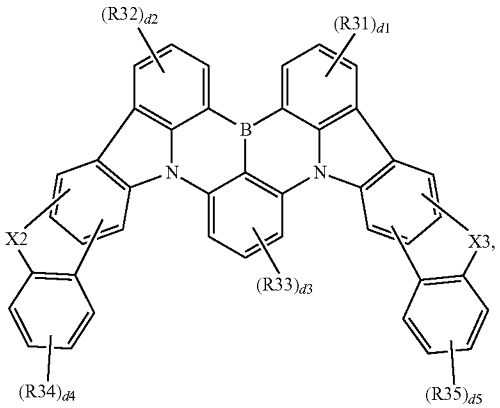

wherein in Formula 7, each of d1, d2 and d3 is independently an integer of 0 to 3, and each of d4 and d5 is independently an integer of 0 to 4, wherein each of R31, R32, R33, R34 and R35 is independently selected from the group consisting of halogen, cyano, a substituted or unsubstituted C1 to C10 alkyl group, a substituted or unsubstituted C6 to C30 aryl group and a substituted or unsubstituted C5 to C30 heteroaryl group, or at least one of two adjacent R31 when d1 is an integer of 2 or more, two adjacent R32 when d2 is an integer of 2 or more, two adjacent R33 when d3 is an integer of 2 or more, two adjacent R34 when d4 is an integer of 2 or more and two adjacent R35 when d5 is an integer of 2 or more is connected to each other to form an aromatic ring or a heteroaromatic ring, and wherein each of X2 and X3 is independently selected from NR36, O and S, and R36 is selected from the group consisting of hydrogen, a substituted or unsubstituted C1 to C10 alkyl group, a substituted or unsubstituted C6 to C30 aryl group and a substituted or unsubstituted C5 to C30 heteroaryl group.

Another aspect of the present disclosure is an organic light emitting device including a substrate including a red pixel region, a green pixel region and a blue pixel region; and the above organic light emitting diode disposed on or over the substrate and in the green pixel region.

It is to be understood that both the foregoing general description and the following detailed description are explanatory and are intended to provide further explanation of the inventive concepts as claimed.

BRIEF DESCRIPTION OF THE DRAWINGS

The accompanying drawings, which are included to provide a further understanding of the present disclosure and are incorporated in and constitute a part of this application, illustrate embodiments of the present disclosure and together with the description serve to explain principles of the present disclosure.

DETAILED DESCRIPTION OF THE EMBODIMENTS

Reference will now be made in detail to some of the examples and preferred embodiments, which are illustrated in the accompanying drawings. All the components of each OLED and each organic light emitting display device according to all embodiments of the present disclosure are operatively coupled and configured.

Figure 1:
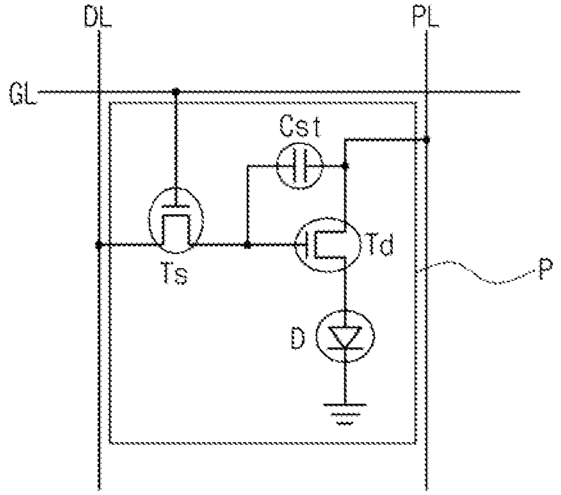
FIG. 1 is a schematic circuit diagram of an organic light emitting display device according to one or more embodiments of the present disclosure.

FIG. 1 is a schematic circuit diagram of an organic light emitting display device of the present disclosure.

As shown in FIG. 1, an organic light emitting display device includes a gate line GL, a data line DL, a power line PL, a switching thin film transistor TFT Ts, a driving TFT Td, a storage capacitor Cst, and an OLED D. The gate line GL and the data line DL cross each other to define a pixel region P. The pixel region can include a red pixel region, a green pixel region and a blue pixel region.

The switching TFT Ts is connected to the gate line GL and the data line DL, and the driving TFT Td and the storage capacitor Cst are connected to the switching TFT Ts and the power line PL. The OLED D is connected to the driving TFT Td.

In the organic light emitting display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the OLED D from the power line PL. As a result, the OLED D emits light. In this case, when the driving TFT Td is turned on, a level of an electric current applied from the power line PL to the OLED D is determined such that the OLED D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the OLED D is maintained to next frame.

As a result, the organic light emitting display device displays a desired image.

Figure 2:
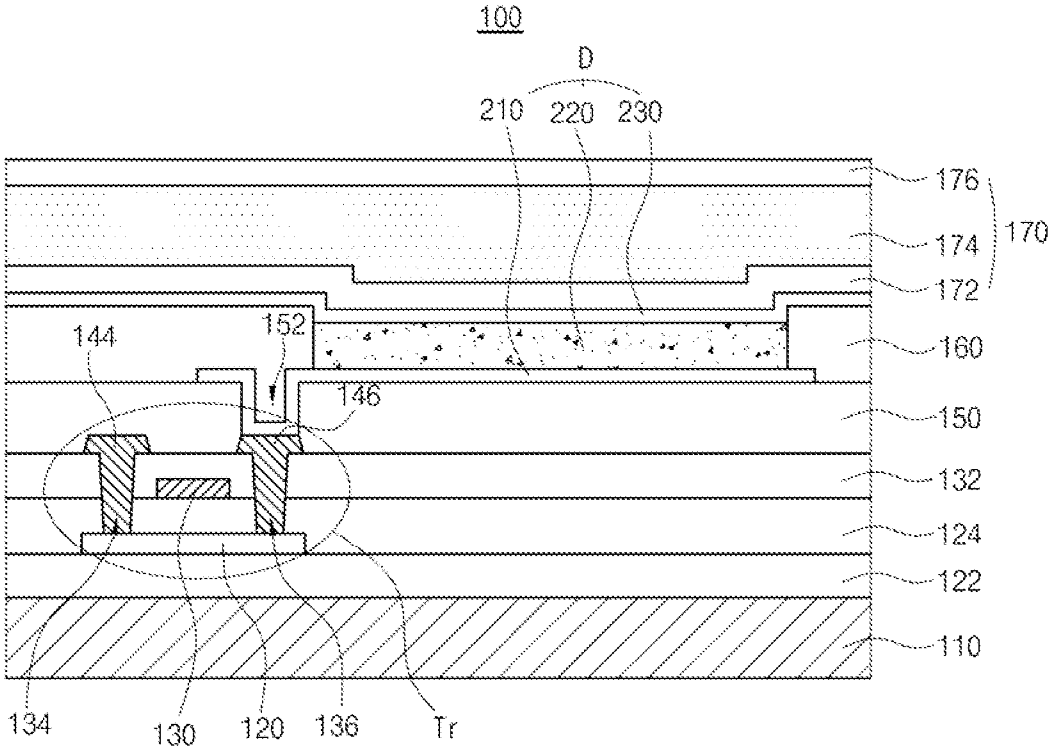
FIG. 2 is a schematic cross-sectional view of an organic light emitting display device according to a first embodiment of the present disclosure.

FIG. 2 is a schematic cross-sectional view of an organic light emitting display device according to a first embodiment of the present disclosure.

As shown in FIG. 2, the organic light emitting display device 100 includes a substrate 110, a TFT Tr on or over the substrate 110, a planarization layer 150 covering the TFT Tr and an OLED D on the planarization layer 150 and connected to the TFT Tr. A red pixel region, a green pixel region and a blue pixel region can be defined on the substrate 110.

The substrate 110 can be a glass substrate or a flexible substrate. For example, the flexible substrate can be one of a polyimide (PI) substrate, a polyethersulfone (PES) substrate, a polyethylenenaphthalate (PEN) substrate, a polyethylene terephthalate (PET) substrate and a polycarbonate (PC) substrate.

A buffer layer 122 is formed on the substrate, and the TFT Tr is formed on the buffer layer 122. The buffer layer 122 can be omitted, in certain embodiments. For example, the buffer layer 122 can be formed of an inorganic insulating material, e.g., silicon oxide or silicon nitride.

A semiconductor layer 120 is formed on the buffer layer 122. The semiconductor layer 120 can include an oxide semiconductor material or polycrystalline silicon.

When the semiconductor layer 120 includes the oxide semiconductor material, a light-shielding pattern can be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities can be doped into both sides of the semiconductor layer 120.

A gate insulating layer 124 is formed on the semiconductor layer 120. The gate insulating layer 124 can be formed of an inorganic insulating material such as silicon oxide or silicon nitride.

A gate electrode 130, which is formed of a conductive material, e.g., metal, is formed on the gate insulating layer 124 to correspond to a center of the semiconductor layer 120. In FIG. 2, the gate insulating layer 124 is formed on an entire surface of the substrate 110. Alternatively, the gate insulating layer 124 can be patterned to have the same shape as the gate electrode 130.

An interlayer insulating layer 132 is formed on the gate electrode 130 and over an entire surface of the substrate 110. The interlayer insulating layer 132 can be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 120. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 144 and a drain electrode 146, which are formed of a conductive material, e.g., metal, are formed on the interlayer insulating layer 132.

The source electrode 144 and the drain electrode 146 are spaced apart from each other with respect to the gate electrode 130 and respectively contact both sides of the semiconductor layer 120 through the first and second contact holes 134 and 136.

The semiconductor layer 120, the gate electrode 130, the source electrode 144 and the drain electrode 146 constitute the TFT Tr. The TFT Tr serves as a driving element. Namely, the TFT Tr is the driving TFT Td (of FIG. 1).

In the TFT Tr, the gate electrode 130, the source electrode 144, and the drain electrode 146 are positioned over the semiconductor layer 120. Namely, the TFT Tr has a coplanar structure.

Alternatively, in the TFT Tr, the gate electrode can be positioned under the semiconductor layer, and the source and drain electrodes can be positioned over the semiconductor layer such that the TFT Tr can have an inverted staggered structure. In this instance, the semiconductor layer can include amorphous silicon.

In some aspects, the gate line and the data line cross each other to define the pixel region, and the switching TFT is formed to be connected to the gate and data lines. The switching TFT is connected to the TFT Tr as the driving element. In addition, the power line, which can be formed to be parallel to and spaced apart from one of the gate and data lines, and the storage capacitor for maintaining the voltage of the gate electrode of the TFT Tr in one frame can be further formed.

A planarization layer 150 is formed on an entire surface of the substrate 110 to cover the source and drain electrodes 144 and 146. The planarization layer 150 provides a flat top surface and has a drain contact hole 152 exposing the drain electrode 146 of the TFT Tr.

The OLED D is disposed on the planarization layer 150 and includes a first electrode 210, which is connected to the drain electrode 146 of the TFT Tr, an organic light emitting layer 220 and a second electrode 230. The organic light emitting layer 220 and the second electrode 230 are sequentially stacked on the first electrode 210. The OLED D is positioned in each of the red, green and blue pixel regions and respectively emits the red, green and blue light.

The first electrode 210 is separately formed in each pixel region. The first electrode 210 can be an anode and can include a transparent conductive oxide material layer, which can be formed of a conductive material, e.g., a transparent conductive oxide (TCO), having a relatively high work function, and a reflection layer. Namely, the first electrode 210 can be a reflective electrode.

Alternatively, the first electrode 210 can have a single-layered structure of the transparent conductive oxide material layer. Namely, the first electrode 210 can be a transparent electrode.

For example, the transparent conductive oxide material layer can be formed of one of indium-tin-oxide (ITO), indium-zinc-oxide (IZO), indium-tin-zinc-oxide (ITZO), tin oxide (SnO), zinc oxide (ZnO), indium-copper-oxide (ICO) and aluminum-zinc-oxide (Al:ZnO, AZO), and the reflection layer can be formed of one of silver (Ag), an alloy of Ag and one of palladium (Pd), copper (Cu), indium (In) and neodymium (Nd), and aluminum-palladium-copper (APC) alloy. For example, the first electrode 210 can have a structure of ITO/Ag/ITO or ITO/APC/ITO.

In addition, a bank layer 160 is formed on the planarization layer 150 to cover an edge of the first electrode 210. Namely, the bank layer 160 is positioned at a boundary of the pixel region and exposes a center of the first electrode 210 in the pixel region.

The organic light emitting layer 220 as an emitting unit is formed on the first electrode 210. The organic light emitting layer 220 include a first emitting part including a first green emitting material layer (EML) and a second emitting part including a second green EML. Namely, the organic light emitting layer 220 has a multi-stack structure such that the OLED D has a tandem structure.

Each of the first and second emitting parts can further include at least one of a hole injection layer (HIL), a hole transporting layer (HTL), an electron blocking layer (EBL), a hole blocking layer (HBL), an electron transporting layer (ETL) and an electron injection layer (EIL) to have a multi-layered structure. In addition, the organic light emitting layer can further include a charge generation layer (CGL) between the first and second emitting parts.

As explained below, in the OLED D in the green pixel region, each of the first and second green EMLs includes a fluorescent emitting layer including a delayed fluorescent compound and a fluorescent compound and a phosphorescent emitting layer including a phosphorescent compound. As a result, the OLED D has advantages in an emitting efficiency, a full width at half maximum (FWHM) and a lifespan.

The second electrode 230 is formed over the substrate 110 where the organic light emitting layer 220 is formed. The second electrode 230 covers an entire surface of the display area and can be formed of a conductive material having a relatively low work function to serve as a cathode. For example, the second electrode 230 can be formed of aluminum (Al), magnesium (Mg), calcium (Ca), silver (Ag) or their alloy, e.g., Mg—Ag alloy (MgAg). The second electrode 230 can have a thin profile, e.g., 10 to 30 nm, to be transparent (or semi-transparent).

In some aspects, the OLED D can further include a capping layer on the second electrode 230. The emitting efficiency of the OLED D can be further improved by the capping layer.

An encapsulation film (or an encapsulation layer) 170 is formed on the second electrode 230 to prevent penetration of moisture into the OLED D. The encapsulation film 170 includes a first inorganic insulating layer 172, an organic insulating layer 174 and a second inorganic insulating layer 176 sequentially stacked, but it is not limited thereto.

In some aspects, the organic light emitting display device 100 can include a color filter corresponding to the red, green and blue pixel regions. For example, the color filter can be positioned on or over the OLED D or the encapsulation film 170.

In addition, the organic light emitting display device 100 can further include a cover window on or over the encapsulation film 170 or the color filter. In this instance, the substrate 110 and the cover window have a flexible property such that a flexible organic light emitting display device can be provided.

Figure 3:
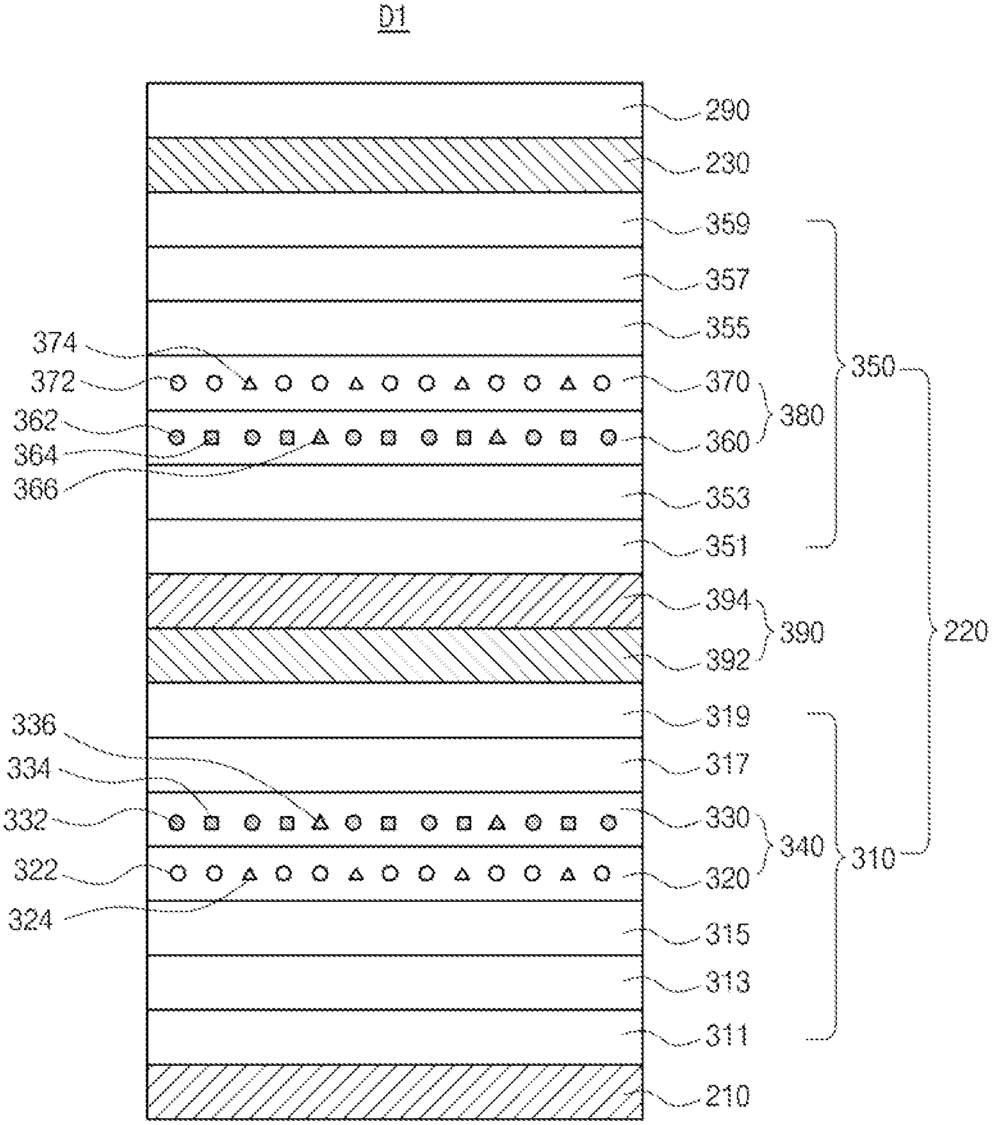
FIG. 3 is a schematic cross-sectional view of an OLED according to a second embodiment of the present disclosure.

FIG. 3 is a schematic cross-sectional view of an OLED according to a second embodiment of the present disclosure.

As shown in FIG. 3, the OLED D1 includes the first electrode 210 as a reflective electrode, the second electrode 230 as a transparent electrode (or a semi-transparent electrode) facing the first electrode 210, and the organic light emitting layer 220 therebetween. The organic light emitting layer 220 includes a first emitting part 310 including a first EML 340, which includes a first emitting layer 320 and a second emitting layer 330, and a second emitting part 350 including a second EML 380, which includes a third emitting layer 360 and a fourth emitting layer 370. In addition, the organic light emitting layer 220 can further include a CGL 390 between the first and second emitting parts 310 and 350. Moreover, the OLED D1 can further include a capping layer 290 for enhancing (improving) an emitting efficiency.

The organic light emitting display device can include a red pixel region, a green pixel region and a blue pixel region, and the OLED D1 is positioned in the green pixel region.

The first electrode 210 can be anode, and the second electrode 230 can be a cathode. The first electrode 210 is a reflective electrode, and the second electrode 230 is a transparent electrode (or a semi-transparent electrode). For example, the first electrode 210 can have a structure of ITO/Ag/ITO, and the second electrode 230 can be formed of MgAg or Al. Namely, the first electrode 210 can have a first transmittance, and the second electrode 230 can have a second transmittance greater than the first transmittance.

In the first emitting part 310, the first emitting layer 320 is positioned between the first electrode 210 and the second emitting layer 330. Namely, the first emitting layer 310 is disposed to be closer to the first electrode 210, and the second emitting layer 320 is disposed to be closer to the second electrode 230. The first emitting layer 320 is a phosphorescent emitting layer, and the second emitting layer 330 is a fluorescent emitting layer.

In the second emitting part 350, the fourth emitting layer 370 is positioned between the second electrode 230 and the third emitting layer 360. Namely, the third emitting layer 360 is disposed to be closer to the first electrode 210, and the fourth emitting layer 370 is disposed to be closer to the second electrode 230. The third emitting layer 360 is a fluorescent emitting layer, and the fourth emitting layer 370 is a phosphorescent emitting layer. Namely, in the first emitting part 310, the second emitting layer 330 being the fluorescent emitting layer is positioned to be closer to the second electrode 230 being the transparent electrode (or semi-transparent electrode), while in the second emitting part 350, the fourth emitting layer being the phosphorescent layer is positioned to be closer to the second electrode 230 being the transparent electrode.

The first emitting layer 320 includes a first compound 322 as a first host and a second compound 324 as a first phosphorescent dopant (or a first phosphorescent emitter). The second emitting layer 330 includes a third compound 332 as a second host, a fourth compound 334 as an auxiliary host (or an auxiliary dopant) and a fifth compound 336 as a first fluorescent dopant (or a first fluorescent emitter). The fourth compound 334 is a delayed fluorescent compound.

The third emitting layer 360 includes a sixth compound 362 as a third host, a seventh compound 364 as an auxiliary host and an eighth compound 366 as a second fluorescent dopant. The seventh compound 364 is a delayed fluorescent compound. The fourth emitting layer 370 includes a ninth compound 372 as a fourth host and a tenth compound 374 as a second phosphorescent dopant.

Each of the first compound 322 as the host of the first emitting layer 320, the third compound 332 as the host of the second emitting layer 330, the sixth compound 362 as the host of the third emitting layer 360 and the ninth compound 372 as the host of the fourth emitting layer 370 is represented by Formula 1-1.

[Formula 1-1]

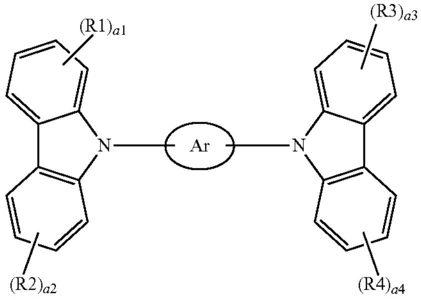

In Formula 1-1, Ar is selected from the group consisting of a substituted or unsubstituted C6 to C30 arylene group and a substituted or unsubstituted C5 to C30 heteroarylene group. Each of R1, R2, R3 and R4 is independently selected from the group consisting of a substituted or unsubstituted C1 to C10 alkyl group and a substituted or unsubstituted C6 to C30 aryl group, and each of a1, a2, a3 and a4 is independently an integer from 0 to 4.

In the present disclosure, without specific definition, a substituent can be at least one of deuterium (D), tritium, halogen, cyano, a C1 to C10 alkyl group and a C6 to C30 aryl group. In some preferred embodiments, the halogen may be any one of fluorine (F), chlorine (Cl), bromine (Br), iodine (I), astatine (At), or tennessine (Ts)).

In the present disclosure, the C6 to C30 aryl group (or C6 to C30 arylene group) can be selected from the group consisting of phenyl, biphenyl, terphenyl, naphthyl, anthracenyl, pentanenyl, indenyl, indenoindenyl, heptalenyl, biphenylenyl, indacenyl, phenanthrenyl, benzophenanthrenyl, dibenzophenanthrenyl, azulenyl, pyrenyl, fluoranthenyl, triphenylenyl, chrysenyl, tetraphenyl, tetrasenyl, picenyl, pentaphenyl, pentacenyl, fluorenyl, indenofluorenyl and spiro-fluorenyl.

In the present disclosure, the C5 to C30 heteroaryl group can be selected from the group consisting of pyrrolyl, pyridinyl, pyrimidinyl, pyrazinyl, pyridazinyl, triazinyl, tetrazinyl, imidazolyl, pyrazolyl, indolyl, isoindolyl, indazolyl, indolizinyl, pyrrolizinyl, carbazolyl, benzocarbazolyl, dibenzocarbazolyl, indolocarbazolyl, indenocarbazolyl, benzofurocarbazolyl, benzothienocarbazolyl, quinolinyl, isoquinolinyl, phthalazinyl, quinoxalinyl, cinnolinyl, quinazolinyl, quinozolinyl, quinolinyl, purinyl, phthalazinyl, quinoxalinyl, benzoquinolinyl, benzoisoquinolinyl, benzoquinazolinyl, benzoquinoxalinyl, acridinyl, phenanthrolinyl, perimidinyl, phenanthridinyl, pteridinyl, cinnolinyl, naphtharidinyl, furanyl, oxazinyl, oxazolyl, oxadiazolyl, triazolyl, dioxynyl, benzofuranyl, dibenzofuranyl, thiopyranyl, xanthenyl, chromanyl, isochromanyl, thioazinyl, thiophenyl, benzothiophenyl, dibenzothiophenyl, difuropyrazinyl, benzofurodibenzofuranyl, benzothienobenzothiophenyl, benzothienodibenzothiophenyl, benzothienobenzofuranyl, and benzothienodibenzofuranyl.

For example, in Formula 1-1, Ar can be one of biphenylene and phenylene.

Namely, the first compound 322 as the host of the first emitting layer 320, the third compound 332 as the host of the second emitting layer 330, the sixth compound 362 as the host of the third emitting layer 360 and the ninth compound 372 as the host of the fourth emitting layer 370 have the same chemical structure and can be same or different.

Formula 1-1 can be represented by Formula 1-2.

[Formula 1-2]

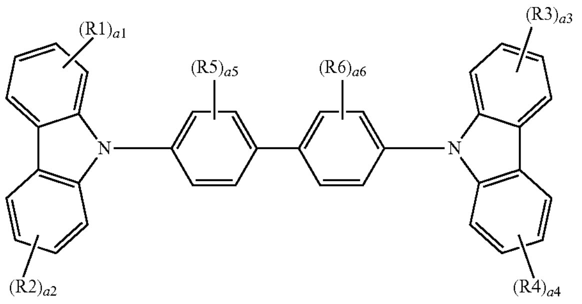

In Formula 1-2, each of R5 and R6 is independently selected from the group consisting of a substituted or unsubstituted C1 to C10 alkyl group and a substituted or unsubstituted C6 to C30 aryl group, and each of a5 and a6 is independently an integer of 0 to 4. The definitions of R1, R2, R3, R4, a1, a2, a3, and a4 are same as those in Formula 1-1.

Alternatively, Formula 1-1 can be represented by Formula 1-3.

[Formula 1-3]

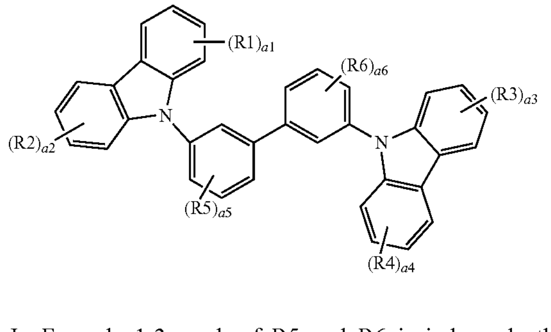

In Formula 1-3, each of R5 and R6 is independently selected from the group consisting of a substituted or unsubstituted C1 to C10 alkyl group and a substituted or unsubstituted C6 to C30 aryl group, and each of a5 and a6 is independently an integer of 0 to 4. The definitions of R1, R2, R3, R4, a1, a2, a3, and a4 are same as those in Formula 1-1.

Alternatively, Formula 1-1 can be represented by Formula 1-4.

[Formula 1-4]

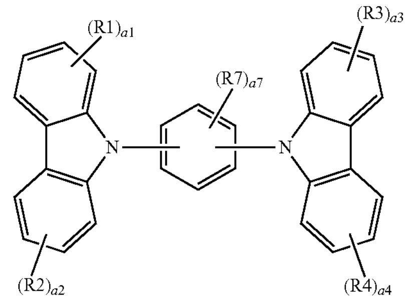

In Formula 1-4, R7 is independently selected from the group consisting of a substituted or unsubstituted C1 to C10 alkyl group and a substituted or unsubstituted C6 to C30 aryl group, and a7 is independently an integer of 0 to 4. The definitions of R1, R2, R3, R4, a1, a2, a3, and a4 are same as those in Formula 1-1.

Namely, in the OLED D1 in the green pixel region, each of the first compound 322 as the host of the first emitting layer 320, the third compound 332 as the host of the second emitting layer 330, the sixth compound 362 as the host of the third emitting layer 360 and the ninth compound 372 as the host of the fourth emitting layer 370 has a structure having two carbazole groups connected (combined, linked or joined) to a linker, e.g., biphenylene or phenylene. In this instance, as represented by Formula 1-2, when two carbazole groups and the liner are connected to be a para-position, the property of the OLED D1 can be further improved.

For example, each of the first compound 322 as the host of the first emitting layer 320, the third compound 332 as the host of the second emitting layer 330, the sixth compound 362 as the host of the third emitting layer 360 and the ninth compound 372 as the host of the fourth emitting layer 370 can be one of the compounds in Formula 2.

[Formula 2]

H1

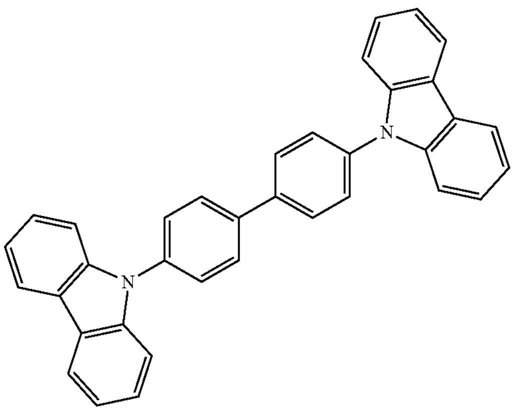

-continued

H2

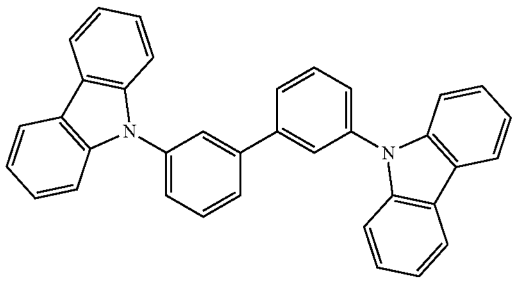

H3

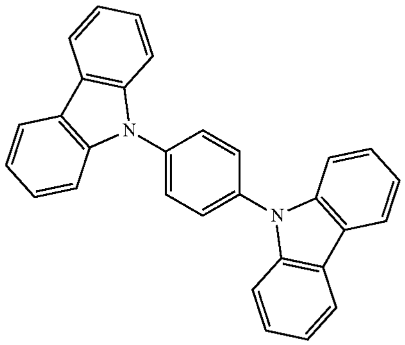

H4

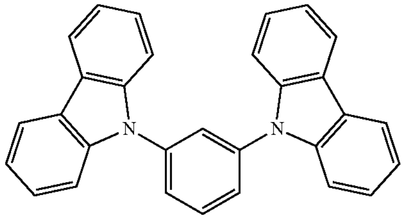

Each of the second compound 324 as the first phosphorescent dopant of the first emitting layer 320 and the tenth compound 374 as the second phosphorescent dopant of the fourth emitting layer 370 is an iridium compound represented by Formula 3.

[Formula 3]

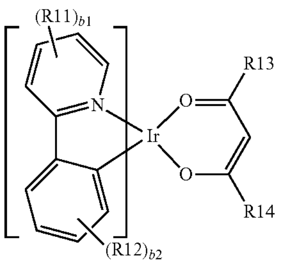

In Formula 3, each of R11 and R12 is independently selected from the group consisting of halogen, a substituted or unsubstituted C1 to C10 alkyl group, a substituted or unsubstituted C6 to C30 aryl group and a substituted or unsubstituted C5 to C30 heteroaryl group, and each of b1 and b2 is independently an integer of 0 to 4. Each of R13 and R14 is independently selected from the group consisting of hydrogen (H), halogen, a substituted or unsubstituted C1 to C10 alkyl group, a substituted or unsubstituted C6 to C30 aryl group and a substituted or unsubstituted C5 to C30 heteroaryl group.

For example, each of R11, R12, R13 and R14 can be independently a C1 to C10 alkyl group, e.g., methyl or tert-butyl.

In some preferred embodiments of Formula 3, each of R11, R12, R13 and R14 is independently a substituted or unsubstituted C1 to C10 alkyl group selected from methyl, ethyl, n-propyl, isopropyl, n-butyl, sec-butyl, isobutyl, tert-butyl, pentyl, isopentyl, sec-pentyl, hexyl, heptyl, octyl, nonyl and decyl.

Namely, the second compound 324 as the first phosphorescent dopant of the first emitting layer 320 and the tenth compound 374 as the second phosphorescent dopant of the fourth emitting layer 370 have the same chemical structure and can be same or different.

For example, each of the second compound 324 as the first phosphorescent dopant of the first emitting layer 320 and the tenth compound 374 as the second phosphorescent dopant of the fourth emitting layer 370 can one of the compounds in Formula 4.

[Formula 4]

PD1

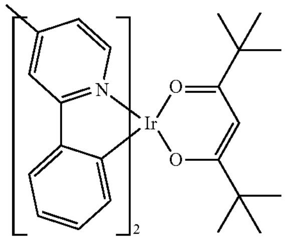

PD2

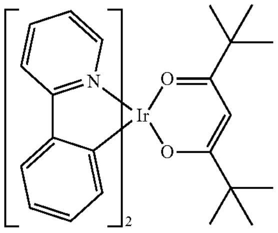

Each of the fourth compound 334 as the auxiliary host of the second emitting layer 330 and the seventh compound 364 as the auxiliary host of the third emitting layer 360 is represented by Formula 5.

[Formula 5]

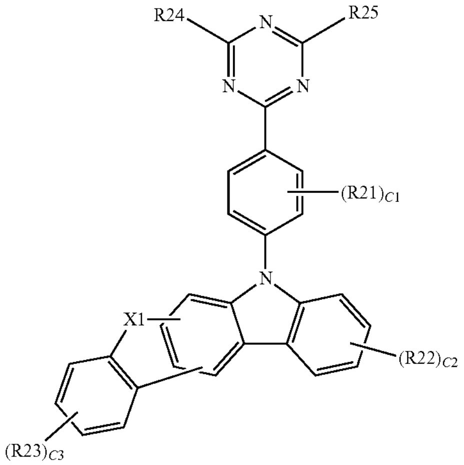

In Formula 5, each of R21, R22 and R23 is independently selected from the group consisting of halogen, cyano, a substituted or unsubstituted C1 to C10 alkyl group, a substituted or unsubstituted C6 to C30 aryl group and a substituted or unsubstituted C5 to C30 heteroaryl group, and each of c1, c2, and c3 is independently an integer of 0 to 4. X1 is selected from NR26, O and S, and each of R24, R25 and R26 is independently selected from the group consisting of hydrogen, a substituted or unsubstituted C1 to C10 alkyl group, a substituted or unsubstituted C6 to C30 aryl group and a substituted or unsubstituted C5 to C30 heteroaryl group.

For example, c1, c2 and c3 can be 0, and each of R24, R25 and R26 can be independently a substituted or unsubstituted C6 to C30 aryl group, e.g., phenyl.

In certain preferred embodiments, in Formula 5, (i) each of c1, c2, and c3 is zero, (ii) X1 is selected from NR26, O and S, and/or (iii) each of R24, R25 and R26 is independently selected from the group consisting of a substituted or unsubstituted C1 to C10 alkyl group, and a substituted or unsubstituted phenyl group.

Namely, the fourth compound 334 as the auxiliary host of the second emitting layer 330 and the seventh compound 364 as the auxiliary host of the third emitting layer 360 have the same chemical structure and can be same or different.

For example, each of the fourth compound 334 as the auxiliary host of the second emitting layer 330 and the seventh compound 364 as the auxiliary host of the third emitting layer 360 can be one of the compounds in Formula 6.

[Formula 6]

TD1

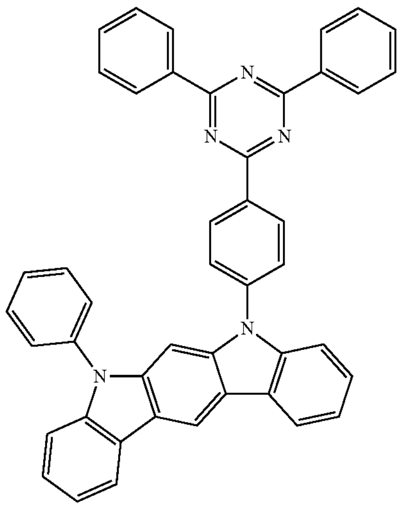

TD2

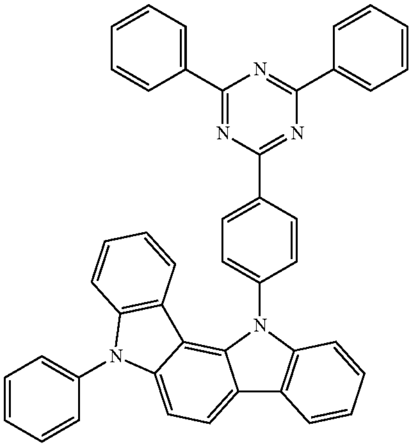

TD3

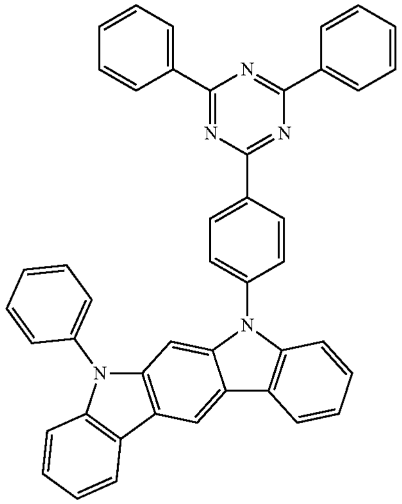

-continued
TD4
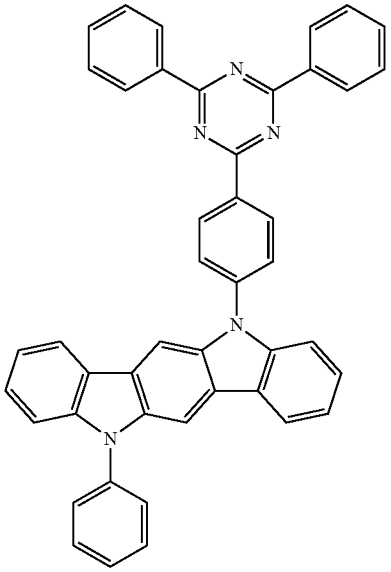
TD5
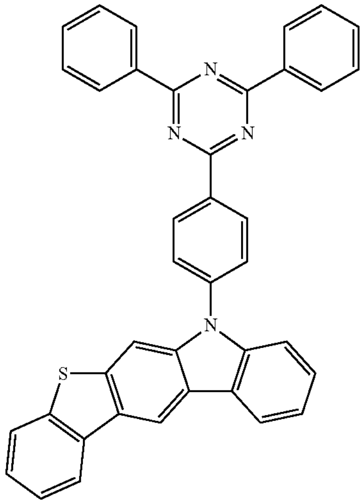
TD6
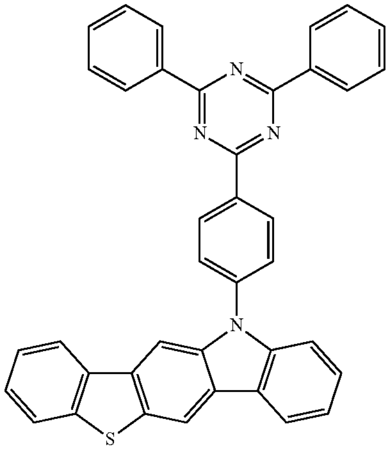
-continued
TD7
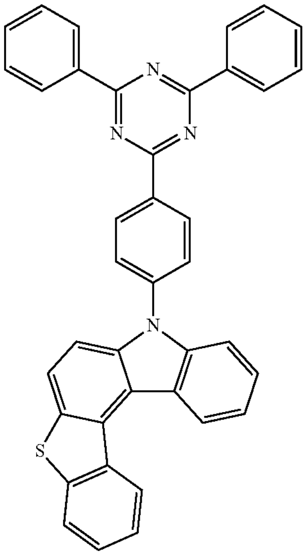
TD8
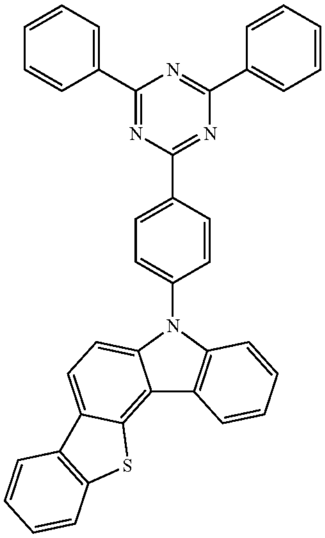
TD9
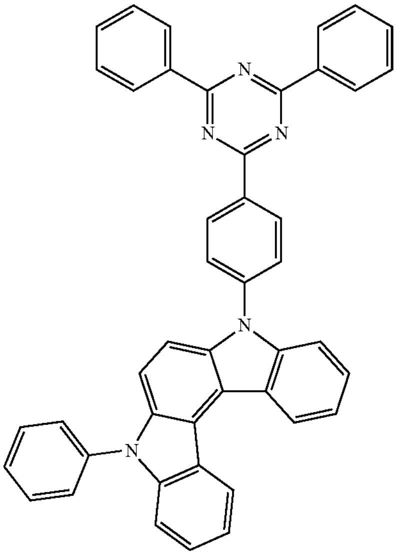

TD10
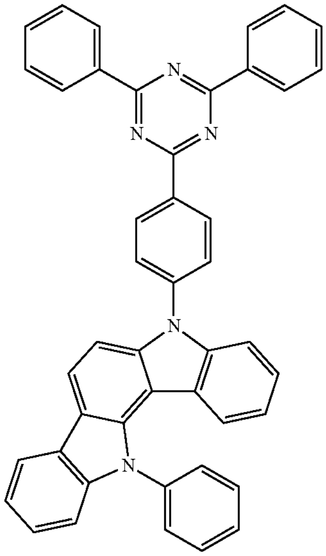
TD11
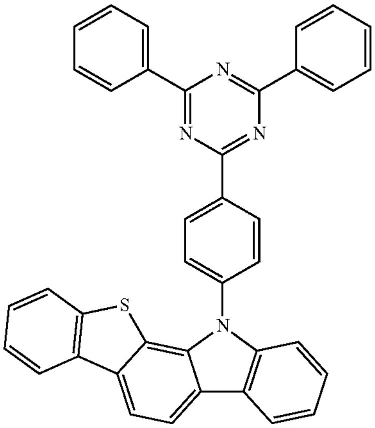
TD12
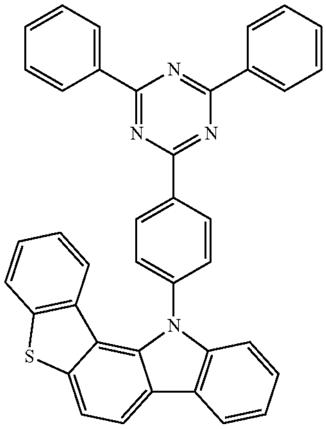
TD13
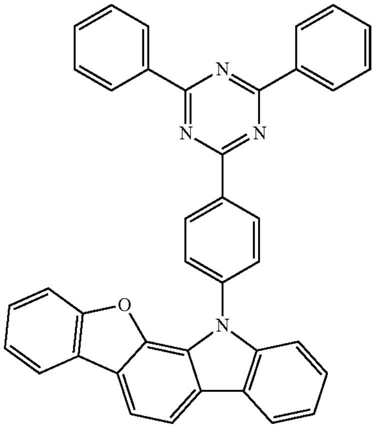
TD14
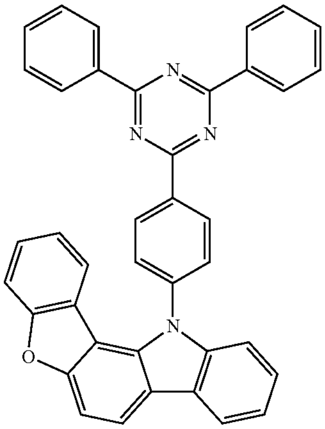
TD15
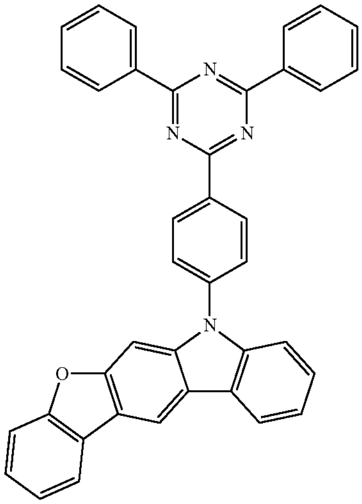

-continued

TD16

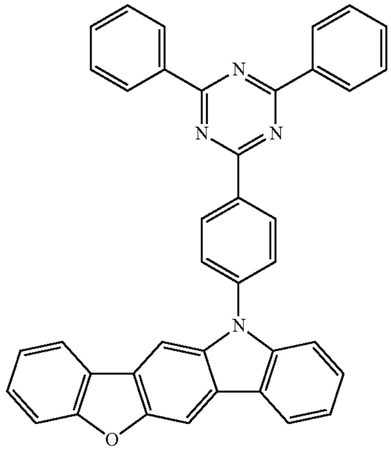

Each of the fifth compound 336 as the first fluorescent dopant of the second emitting layer 330 and the eighth compound 366 as the second fluorescent dopant of the third emitting layer 360 is represented by Formula 7.

[Formula 7]

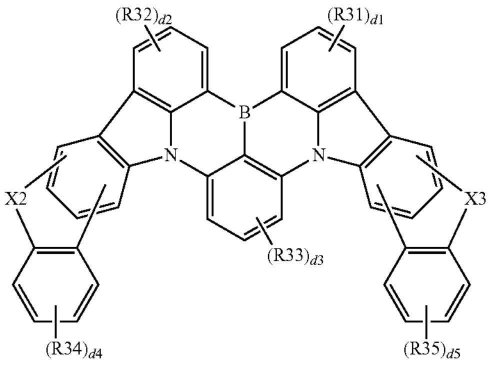

In Formula 7, each of d1, d2 and d3 is independently an integer of 0 to 3, and each of d4 and d5 is independently an integer of 0 to 4. Each of R31, R32, R33, R34 and R35 is independently selected from the group consisting of halogen, cyano, a substituted or unsubstituted C1 to C10 alkyl group, a substituted or unsubstituted C6 to C30 aryl group and a substituted or unsubstituted C5 to C30 heteroaryl group, or at least one of two adjacent R31 when d1 is an integer of 2 or more, two adjacent R32 when d2 is an integer of 2 or more, two adjacent R33 when d3 is an integer of 2 or more, two adjacent R34 when d4 is an integer of 2 or more and two adjacent R35 when d5 is an integer of 2 or more is connected to each other to form an aromatic ring or a heteroaromatic ring. Each of X2 and X3 is independently selected from NR36, O and S, and R36 is selected from the group consisting of hydrogen, a substituted or unsubstituted C1 to C10 alkyl group, a substituted or unsubstituted C6 to C30 aryl group and a substituted or unsubstituted C5 to C30 heteroaryl group.

In certain preferred embodiments, in Formula 7, (i) each of d1, d2 and d3 is independently an integer of 0 or 1, (ii) each of d4 and d5 is independently an integer of 0 or 1, (iii) each of R31, R32, R33, R34 and R35 is independently a substituted or unsubstituted C1 to C10 alkyl group, a substituted or unsubstituted carbazole, a substituted or unsubstituted phenyl group, and/or (iv) each of X2 and X3 is independently NR36, where R36 is selected from the group consisting of hydrogen, a substituted or unsubstituted C1 to C10 alkyl group, and a substituted or unsubstituted phenyl group.

For example, d1 and d2 can be 0, and each of d3, d4 and d5 can independently 0 or 1. R33 can be selected from the group consisting of cyano, a C6 to C30 aryl group, e.g., phenyl, unsubstituted or substituted with one of halogen, e.g., F, cyano and a C1 to C10 alkyl group, e.g., tert-methyl, and a C5 to C30 heteroaryl group, e.g., carbazolyl, unsubstituted or substituted with one of halogen, e.g., F, cyano and a C1 to C10 alkyl group, e.g., tert-methyl. Each of R34 and R35 can be independently a C1 to C10 alkyl group, e.g., tert-butyl. X2 and X3 can be NR36, and R36 can be a C6 to C30 aryl, e.g., phenyl.

Namely, the fifth compound 336 as the first fluorescent dopant of the second emitting layer 330 and the eighth compound 366 as the second fluorescent dopant of the third emitting layer 360 have the same chemical structure and can be same or different.

Each of the fifth compound 336 as the first fluorescent dopant of the second emitting layer 330 and the eighth compound 366 as the second fluorescent dopant of the third emitting layer 360 can one of the compounds in Formula 8.

[Formula 8]

FD1

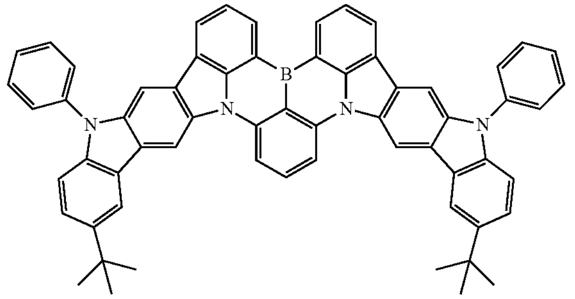

FD2

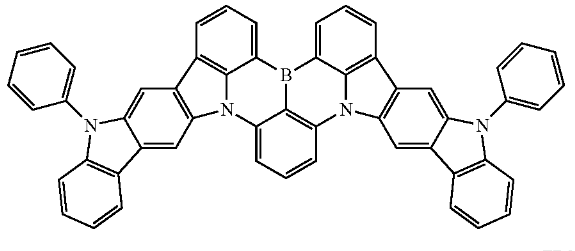

FD3

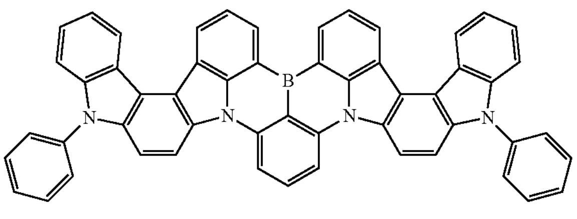

-continued

FD4

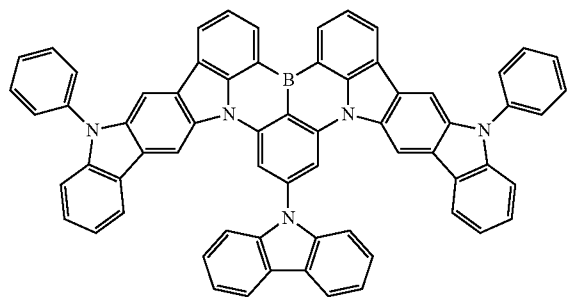

FD5

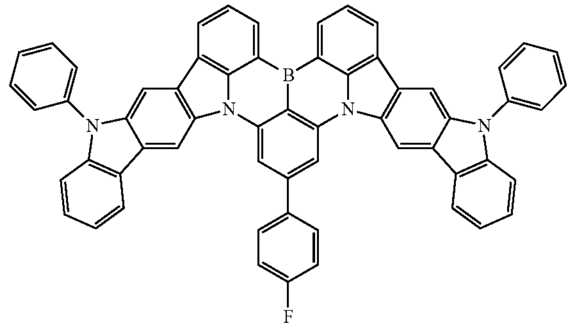

FD6

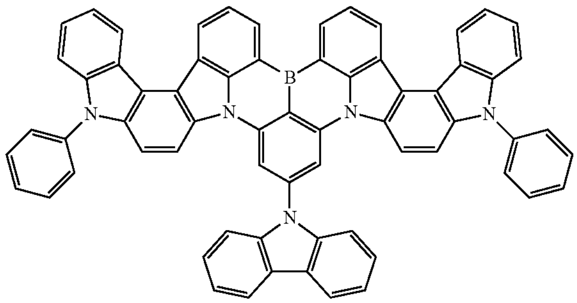

FD7

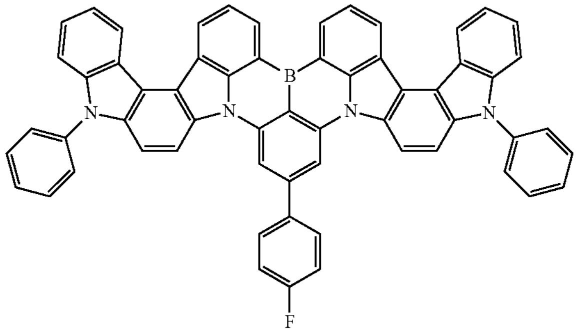

-continued

FD8

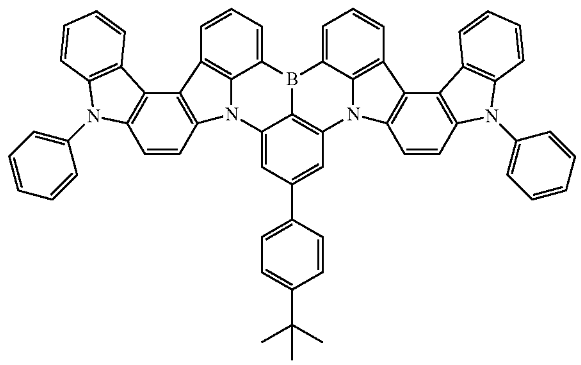

FD9

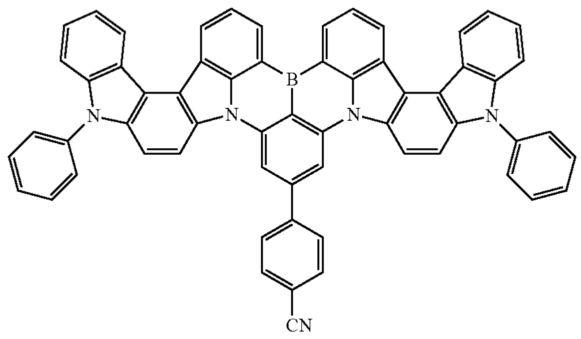

FD10

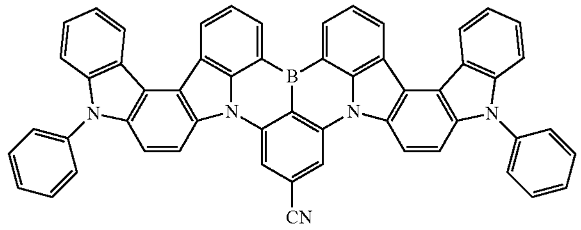

In the first emitting layer 320, a weight % of the first compound 322 is greater than a weight % of the second compound 324. For example, in the first emitting layer 320, the second compound 324 can have 1 to 20 weight % with respect to the first compound 322.

In the second emitting layer 330, a weight % of each of the third and fourth compounds 332 and 334 is greater than a weight % of the fifth compound 336, and the weight % of the third compound 332 can be equal to or greater than the weight % of the fourth compound 334. For example, in the second emitting layer 330, the fourth compound 334 can have 60 to 80 weight % with respect to the third compound 332, and the fifth compound 336 can have 0.1 to 10 weight % with respect to the third compound 332.

In the third emitting layer 360, a weight % of each of the sixth and seventh compounds 362 and 364 is greater than a weight % of the eighth compound 366, and the weight % of the sixth compound 362 can be equal to or greater than the weight % of the seventh compound 364. For example, in the third emitting layer 360, the seventh compound 364 can have 60 to 80 weight % with respect to the sixth compound 362, and the eighth compound 366 can have 0.1 to 10 weight % with respect to the sixth compound 362.

In the fourth emitting layer 370, a weight % of the ninth compound 372 is greater than a weight % of the tenth compound 374. For example, in the fourth emitting layer 370, the tenth compound 374 can have 1 to 20 weight % with respect to the ninth compound 372.

Each of the first to fourth emitting layers 320, 330, 360 and 370 can have a thickness of about 10 to 25 nm. The first to fourth emitting layers 320, 330, 360 and 370 can have the same thickness or different thicknesses.

In the second emitting layer 330, a difference between a lowest unoccupied molecular orbital (LUMO) energy level of the fifth compound 336 "FD" as the first fluorescent dopant and an LUMO energy level of the fourth compound 334 "TD" as the auxiliary host can be 0.1 eV or less. In addition, the difference between an LUMO energy level of the fifth compound 336 "FD" as the first fluorescent dopant and an LUMO energy level of the fourth compound 334 "TD" as the auxiliary host can be −0.6 eV or more. For example, the difference between a lowest unoccupied molecular orbital (LUMO) energy level of the fifth compound 336 "FD" as the first fluorescent dopant and an LUMO energy level of the fourth compound 334 "TD" as the auxiliary host can be −0.6 eV or more and 0.1 eV or less. (0.1 eV≥LUMO (FD)−LUMO(TD)≥−0.6 eV)

In the third emitting layer 360, a difference between an LUMO energy level of the eighth compound 366 "FD" as the second fluorescent dopant and an LUMO energy level of the seventh compound 364 "TD" as the auxiliary host can be 0.1 eV or less. In addition, the difference between an LUMO energy level of the eighth compound 366 "FD" as the second fluorescent dopant and an LUMO energy level of the seventh compound 364 "TD" as the auxiliary host can be −0.6 eV or more. For example, the difference between an LUMO energy level of the eighth compound 366 "FD" as the second fluorescent dopant and an LUMO energy level of the seventh compound 364 "TD" as the auxiliary host can be −0.6 eV or more and 0.1 eV or less. (0.1 eV≥LUMO (FD)−LUMO(TD) ≥−0.6 eV)

As a result, the generation of the exciplex in each of the second and third emitting layers 330 and 360 can be prevented, and the emitting efficiency of each of the second and third emitting layers 330 and 360 can be improved.

A difference between a maximum emission wavelength of the first emitting layer 320 and a maximum emission wavelength of the second emitting layer 330 is 20 nm or less, and a difference between a maximum emission wavelength of the third emitting layer 360 and a maximum emission wavelength of the fourth emitting layer 370 is 20 nm or less. Namely, a difference between a maximum emission wavelength of the second compound 324 in the first emitting layer 320 and a maximum emission wavelength of the fifth compound 336 in the second emitting layer 330 is 20 nm or less, and a difference between a maximum emission wavelength of the eighth compound 366 in the third emitting layer 360 and a maximum emission wavelength of the tenth compound 374 in the fourth emitting layer 370 is 20 nm or less. For example, each of the first to fourth emitting layers 320, 330, 360 and 370 can have an emission wavelength range of 510 to 540 nm.

In addition, a difference between an average emission wavelength of the first emitting part 310 including the first and second emitting layers 320 and 330 and an average emission wavelength of the second emitting part 350 including the third and fourth emitting layers 360 and 370 can be 20 nm or less.

The first emitting part 310 can further include at least one of a first HTL 313 positioned under the first EML 340 and a first ETL 319 positioned on the first EML 340.

In addition, the first emitting part 310 can further include an HIL positioned under the first HTL 313.

Moreover, the first emitting part 310 can further include at least one of a first EBL 315 positioned between the first EML 340 and the first HTL 313 and a first HBL 317 positioned between the first EML 340 and the first ETL 319.

The second emitting part 350 can further include at least one of a second HTL 351 positioned under the second EML 380 and a second ETL 357 positioned on the second EML 380.

In addition, the second emitting part 350 can further include an EIL positioned on the second ETL 357.

Moreover, the second emitting part 350 can further include at least one of a second EBL 353 positioned between the second EML 380 and the second HTL 351 and a second HBL 355 positioned between the second EML 380 and the second ETL 357.

The CGL 390 is positioned between the first and second emitting parts 310 and 350, and the first and second emitting parts 310 and 350 are connected through the CGL 390. The first emitting part 310, the CGL 390 and the second emitting part 350 are sequentially stacked on the first electrode 210. Namely, the first emitting part 310 is positioned between the first electrode 210 and the CGL 390, and the second emitting part 350 is positioned between the second electrode 230 and the CGL 390.

The CGL 390 can be a P-N junction type CGL of an N-type CGL 392 and a P-type CGL 394.

The N-type CGL 392 is positioned between the first ETL 319 and the second HTL 351, and the P-type CGL 394 is positioned between the N-type CGL 392 and the second HTL 351. The N-type CGL 392 provides an electron into the first EML 340 of the first emitting part 310, and the P-type CGL 394 provides a hole into the second EML 380 of the second emitting part 350.

For example, the HIL 311 can include at least one compound selected from the group consisting of 4,4',4"-tris (3-methylphenylamino)triphenylamine (MTDATA), 4,4',4"-tris(N,N-diphenyl-amino)triphenylamine (NATA), 4,4',4"-tris(N-(naphthalene yl)-N-phenyl-amino)triphenylamine (1T-NATA), 4,4',4"-tris(N-(naphthalene-2-yl)-N-phenyl-amino)triphenylamine (2T-NATA), copper phthalocyanine (CuPc), tris(4-carbazoyl-9-yl-phenyl)amine (TCTA), N,N'-diphenyl-N,N'-bis(1-naphthyl)-1,1'-biphenyl-4,4"-diamine (NPB or NPD), 1,4,5,8,9,11-hexaazatriphenylenehexacarbonitrile (dipyrazino[2,3-f:2' 3'-h]quinoxaline-2,3,6,7,10,11-hexacarbonitrile (HAT-CN)), 1,3,5-tris[4-(diphenylamino) phenyl]benzene (TDAPB), poly(3,4-ethylenedioxythiphene)polystyrene sulfonate (PEDOT/PSS), and N-(biphenyl-4-yl)-9,9-dimethyl-N-(4-(9-phenyl-9H-carbazol-3-yl)phenyl)-9H-fluoren-2-amine. The HIL 311 can have a thickness of 1 to 10 nm.

Each of the first and second HTLs 313 and 351 can include at least one compound selected from the group consisting of N,N'-diphenyl-N,N'-bis(3-methylphenyl)-1,1'-biphenyl-4,4'-diamine (TPD), NPB(NPD), 4,4'-bis(N-carbazolyl)-1,1'-biphenyl (CBP), poly[N,N'-bis(4-butylphenyl)-N,N'-bis(phenyl)-benzidine] (poly-TPD), (poly[(9,9-dioctylfluorenyl-2,7-diyl)-co-(4,4-(N-(4-sec-butylphenyl) diphenylamine))] (TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, and N-(biphenyl-4-yl)-N-(4-(9-phenyl-9H-carbazol-3-yl)phenyl)biphenyl-4-amine. Each of the first and second HTLs 311 and 351 can have a thickness of 20 to 30 nm. The first and second HTLs 311 and 351 can have the same thickness or different thicknesses.

Each of the first and second ETLs 319 and 357 can include at least one compound selected from the group consisting of tris-(8-hydroxyquinoline aluminum ($Alq_3$), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis(2-methyl-8-quinolinolato-N1,O8)-(1,1-biphenyl-4-olato)aluminum (BAlq), 4,7-diphenyl-1,10-phenanthroline (Bphen), 2,9-bis (naphthalene-2-yl)-4,7-diphenyl-1,10-phenanthroline (NBphen), 2,9-dimethyl-4,7-diphenyl-1,10-phenathroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3-(pyridin-3-yl)biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)] (PFNBr), tris(phenylquinoxaline) (TPQ), and diphenyl-4-triphenylsilyl-phenylphosphine oxide (TSPO1). Each of the first and second ETLs 319 and 357 can have a thickness of 10 to 40 nm. For example, the thickness of the first ETL 319 can be smaller than the thickness of the second ETL 357.

The EIL 359 can include at least one of an alkali halide compound, such as LiF, CsF, NaF, or $BaF_2$, and an organo-metallic compound, such as Liq, lithium benzoate, or sodium stearate. The EIL 359 can have a thickness of 1 to 10 nm.

Each of the first and second EBLs 315 and 353 can include at least one compound selected from the group consisting of TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, MTDATA, 1,3-bis(carbazol-9-yl)benzene (mCP), 3,3'-bis(N-carbazolyl)-1,1-biphenyl (mCBP), CuPc, N,N'-bis[4-[bis(3-methylphenyl)amino]phenyl]-N,N'-diphenyl-[1,1'-biphenyl]-4,4'-diamine (DNTPD), TDAPB, DCDPA, and 2,8-bis(9-phenyl-9H-carbazol-3-yl)dibenzo[b,d]thiophene). Each of the first and second EBLs 315 and 353 can have a thickness of 5 to 15 nm.

Each of the first and second HBLs 317 and 355 can include at least one compound selected from the group consisting of BCP, BAlq, Alq3, PBD, spiro-PBD, Liq, bis-4,6-(3,5-di-3-pyridylphenyl)-2-methylpyrimidine (B3PYMPM), bis[2-(diphenylphosphino)phenyl]ether oxide (DPEPO), 9-(6-9H-carbazol-9-yl)pyridine-3-yl)-9H-3,9'-bicarbazole, and TSPO1. Each of the first and second HBLs 317 and 355 can have a thickness of 5 to 15 nm.

The N-type CGL 392 can include a host, which can be an anthracene derivative or the material of the ETLs 319 and 357, and a dopant being Li. For example, the dopant, i.e., Li, can have a weight % of 0.5 in the N-type CGL 392. The P-type CGL 394 can include the material of the HIL 311.

Each of the N-type CGL 392 and the P-type CGL 394 can have a thickness of 5 to 20 nm. In addition, the thickness of the N-type CGL 392 can be greater than the thickness of the P-type CGL 394.

The capping layer 290 is positioned on the second electrode 230. For example, the capping layer 290 can include the material of the HTLs 313 and 351 and can have a thickness of 50 to 200 nm.

The OLED D1 includes the first emitting part 310 and the second emitting part 350, and each of the first and second emitting parts 310 and 350 includes a phosphorescent emitting layer and a fluorescent emitting layer. As a result, the OLED D1 has advantages in the emitting efficiency, the FWHM, i.e., the color purity, and the lifespan.

Figure 4:
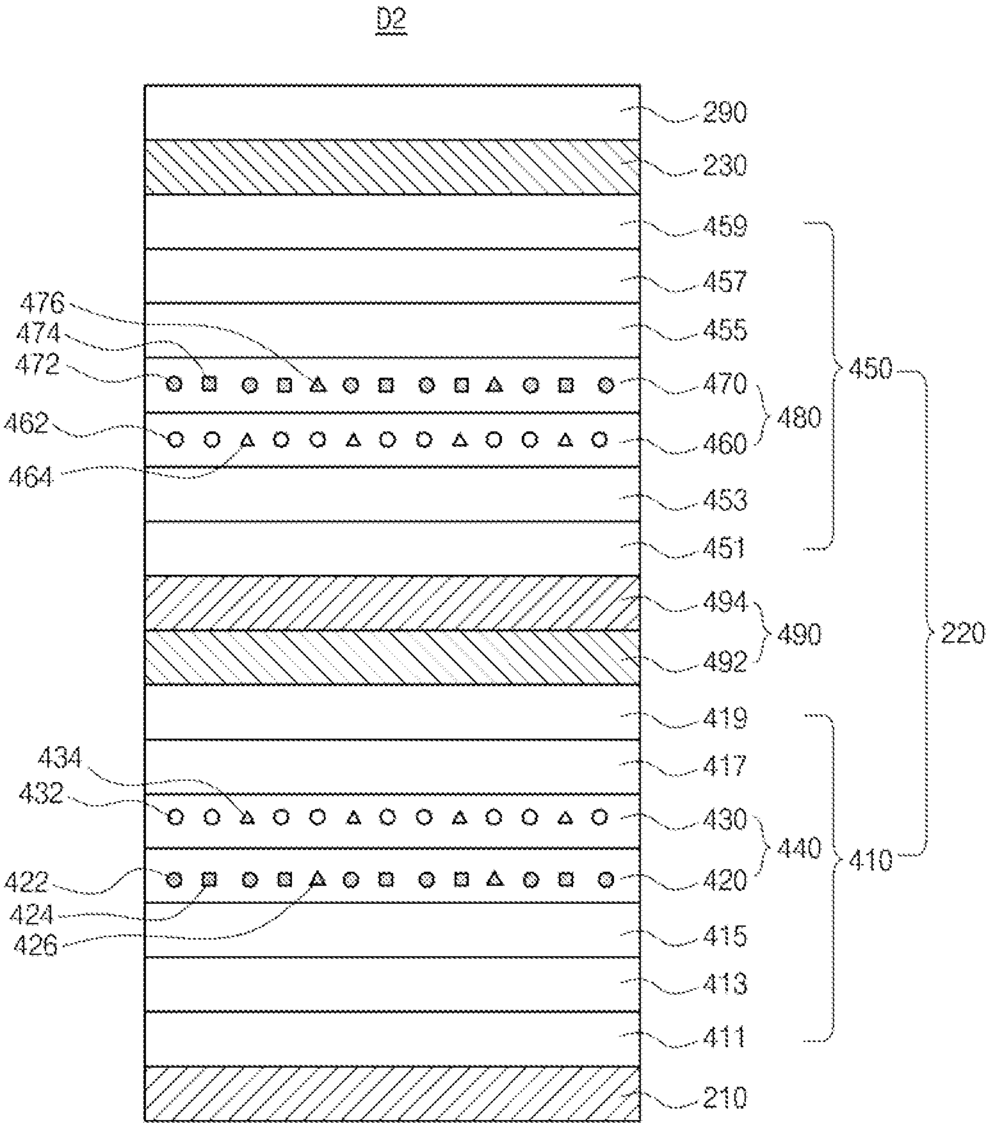
FIG. 4 is a schematic cross-sectional view of an OLED according to a third embodiment of the present disclosure.

FIG. 4 is a schematic cross-sectional view of an OLED according to a third embodiment of the present disclosure.

As shown in FIG. 4, the OLED D2 includes the first electrode 210 as a reflective electrode, the second electrode 230 as a transparent electrode (or a semi-transparent electrode) facing the first electrode 210, and the organic light emitting layer 220 therebetween. The organic light emitting layer 220 includes a first emitting part 410 including a first EML 440, which includes a first emitting layer 420 and a second emitting layer 430, and a second emitting part 450 including a second EML 480, which includes a third emitting layer 460 and a fourth emitting layer 470. In addition, the organic light emitting layer 220 can further include a CGL 490 between the first and second emitting parts 410 and 450. Moreover, the OLED D1 can further include a capping layer 290 for enhancing (improving) an emitting efficiency.

The organic light emitting display device can include a red pixel region, a green pixel region and a blue pixel region, and the OLED D1 is positioned in the green pixel region.

The first electrode 210 can be anode, and the second electrode 230 can be a cathode. The first electrode 210 is a reflective electrode, and the second electrode 230 is a transparent electrode (or a semi-transparent electrode). For example, the first electrode 210 can have a structure of ITO/Ag/ITO, and the second electrode 230 can be formed of MgAg.

In the first emitting part 410, the first emitting layer 420 is positioned between the first electrode 210 and the second emitting layer 430. Namely, the first emitting layer 410 is disposed to be closer to the first electrode 210, and the second emitting layer 420 is disposed to be closer to the second electrode 230. The first emitting layer 420 is a fluorescent emitting layer, and the second emitting layer 430 is a phosphorescent emitting layer.

In the second emitting part 450, the fourth emitting layer 470 is positioned between the second electrode 230 and the third emitting layer 460. Namely, the third emitting layer 460 is disposed to be closer to the first electrode 210, and the fourth emitting layer 470 is disposed to be closer to the second electrode 230. The third emitting layer 460 is a phosphorescent emitting layer, and the fourth emitting layer 470 is a fluorescent emitting layer. Namely, in the first emitting part 410, the second emitting layer 430 being the phosphorescent emitting layer is positioned to be closer to the second electrode 230 being the transparent electrode (or semi-transparent electrode), while in the second emitting part 450, the fourth emitting layer being the fluorescent layer is positioned to be closer to the second electrode 230 being the transparent electrode.

The first emitting layer 420 includes a third compound 422 as a second host, a fourth compound 424 as an auxiliary host (or an auxiliary dopant) and a fifth compound 426 as a first fluorescent dopant (or a first fluorescent emitter). The second emitting layer 430 includes a first compound 432 as a first host and a second compound 434 as a first phosphorescent dopant (or a first phosphorescent emitter). The fourth compound 424 is a delayed fluorescent compound.

The third emitting layer 460 includes a ninth compound 462 as a fourth host and a tenth compound 464 as a second phosphorescent dopant. The fourth emitting layer 470 includes a sixth compound 472 as a third host, a seventh compound 474 as an auxiliary host and an eighth compound 476 as a second fluorescent dopant. The seventh compound 474 is a delayed fluorescent compound.

Each of the first compound 432 as the host of the second emitting layer 430, the third compound 422 as the host of the first emitting layer 420, the sixth compound 472 as the host of the fourth emitting layer 470 and the ninth compound 462 as the host of the third emitting layer 460 is represented by Formula 1-1.

Namely, the first compound 432 as the host of the second emitting layer 430, the third compound 422 as the host of the first emitting layer 420, the sixth compound 472 as the host of the fourth emitting layer 470 and the ninth compound 462 as the host of the third emitting layer 460 have the same chemical structure and can be same or different.

For example, each of the first compound 432 as the host of the second emitting layer 430, the third compound 422 as the host of the first emitting layer 420, the sixth compound 472 as the host of the fourth emitting layer 470 and the ninth compound 462 as the host of the third emitting layer 460 can be represented by one of Formulas 1-2, 1-3 and 1-4. Each of the first compound 432 as the host of the second emitting layer 430, the third compound 422 as the host of the first emitting layer 420, the sixth compound 472 as the host of the fourth emitting layer 470 and the ninth compound 462 as the host of the third emitting layer 460 can be selected from the compounds in Formula 2.

Each of the second compound 343 as the first phosphorescent dopant of the second emitting layer 430 and the tenth compound 436 as the second phosphorescent dopant of the third emitting layer 460 can be an iridium compound represented by Formula 3.

Namely, the second compound 343 as the first phosphorescent dopant of the second emitting layer 430 and the tenth compound 436 as the second phosphorescent dopant of the third emitting layer 460 have the same chemical structure and can be same or different.

For example, each of the second compound 434 as the first phosphorescent dopant of the second emitting layer 430 and the tenth compound 464 as the second phosphorescent dopant of the third emitting layer 460 can be selected from the compounds in Formula 4.

Each of the fourth compound 424 as the auxiliary host of the first emitting layer 420 and the seventh compound 474 as the auxiliary host of the fourth emitting layer 470 can be represented by Formula 5.

Namely, the fourth compound 424 as the auxiliary host of the first emitting layer 420 and the seventh compound 474 as the auxiliary host of the fourth emitting layer 470 have the same chemical structure and can be same or different.

For example, each of the fourth compound 424 as the auxiliary host of the first emitting layer 420 and the seventh compound 474 as the auxiliary host of the fourth emitting layer 470 can be selected from the compounds in Formula 6.

Each of the fifth compound 426 as the first fluorescent dopant of the first emitting layer 420 and the eighth compound 476 as the second fluorescent dopant of the fourth emitting layer 470 can be represented by Formula 7.

Namely, the fifth compound 426 as the first fluorescent dopant of the first emitting layer 420 and the eighth compound 476 as the second fluorescent dopant of the fourth emitting layer 470 have the same chemical structure and can be same or different.

For example, each of the fifth compound 426 as the first fluorescent dopant of the first emitting layer 420 and the eighth compound 476 as the second fluorescent dopant of the fourth emitting layer 470 can be selected from the compounds in Formula 8.

In the first emitting layer 420, a weight % of each of the third and fourth compounds 422 and 424 is greater than a weight % of the fifth compound 426, and the weight % of the third compound 422 can be equal to or greater than the weight % of the fourth compound 424. For example, in the first emitting layer 420, the fourth compound 424 can have 60 to 80 weight % with respect to the third compound 422, and the fifth compound 426 can have 0.1 to 10 weight % with respect to the third compound 422.

In the second emitting layer 430, a weight % of the first compound 432 is greater than a weight % of the second compound 434. For example, in the second emitting layer 430, the second compound 434 can have 1 to 20 weight % with respect to the first compound 432.

In the third emitting layer 460, a weight % of the ninth compound 462 is greater than a weight % of the tenth compound 464. For example, in the third emitting layer 460, the tenth compound 464 can have 1 to 20 weight % with respect to the ninth compound 462.

In the fourth emitting layer 470, a weight % of each of the sixth and seventh compounds 472 and 474 is greater than a weight % of the eighth compound 476, and the weight % of the sixth compound 472 can be equal to or greater than the weight % of the seventh compound 474. For example, in the fourth emitting layer 470, the seventh compound 474 can have 60 to 80 weight % with respect to the sixth compound 472, and the eighth compound 476 can have 0.1 to 10 weight % with respect to the sixth compound 472.

Each of the first to fourth emitting layers 420, 430, 460 and 470 can have a thickness of about 10 to 25 nm. The first to fourth emitting layers 420, 430, 460 and 470 can have the same thickness or different thicknesses.

In the first emitting layer 420, a difference between an LUMO energy level of the fifth compound 426 "FD" as the first fluorescent dopant and an LUMO energy level of the fourth compound 424 "TD" as the auxiliary host can be −0.6 eV or more and 0.1 eV or less. (0.1 eV≥LUMO (FD)−LUMO(TD)≥−0.6 eV)

In the fourth emitting layer 470, a difference between an LUMO energy level of the eighth compound 476 "FD" as the second fluorescent dopant and an LUMO energy level of the seventh compound 474 "TD" as the auxiliary host can be −0.6 eV or more and 0.1 eV or less. (0.1 eV≥LUMO (FD)−LUMO(TD)≥−0.6 eV)

As a result, the generation of the exciplex in each of the first and fourth emitting layers 420 and 470 can be prevented, and the emitting efficiency of each of the first and fourth emitting layers 420 and 470 can be improved.

A difference between a maximum emission wavelength of the first emitting layer 420 and a maximum emission wavelength of the second emitting layer 430 is 20 nm or less, and a difference between a maximum emission wavelength of the third emitting layer 460 and a maximum emission wavelength of the fourth emitting layer 470 is 20 nm or less. Namely, a difference between a maximum emission wavelength of the second compound 434 in the second emitting layer 430 and a maximum emission wavelength of the fifth compound 426 in the first emitting layer 420 is 20 nm or less, and a difference between a maximum emission wavelength of the eighth compound 476 in the fourth emitting layer 470 and a maximum emission wavelength of the tenth compound 464 in the third emitting layer 460 is 20 nm or less. For example, each of the first to fourth emitting layers 420, 430, 460 and 470 can have an emission wavelength range of 510 to 540 nm.

In addition, a difference between an average emission wavelength of the first emitting part 410 including the first and second emitting layers 420 and 430 and an average emission wavelength of the second emitting part 450 including the third and fourth emitting layers 460 and 470 can be 20 nm or less.

The first emitting part 410 can further include at least one of a first HTL 413 positioned under the first EML 440 and a first ETL 419 positioned on the first EML 440.

In addition, the first emitting part 410 can further include an HIL positioned under the first HTL 413.

Moreover, the first emitting part 410 can further include at least one of a first EBL 415 positioned between the first EML 440 and the first HTL 413 and a first HBL 417 positioned between the first EML 440 and the first ETL 419.

The second emitting part 450 can further include at least one of a second HTL 451 positioned under the second EML 480 and a second ETL 457 positioned on the second EML 480.

In addition, the second emitting part 450 can further include an EIL positioned on the second ETL 457.

Moreover, the second emitting part 450 can further include at least one of a second EBL 453 positioned between the second EML 480 and the second HTL 451 and a second HBL 455 positioned between the second EML 480 and the second ETL 457.

The CGL 490 is positioned between the first and second emitting parts 410 and 450, and the first and second emitting parts 410 and 450 are connected through the CGL 490. The first emitting part 410, the CGL 490 and the second emitting part 450 are sequentially stacked on the first electrode 210. Namely, the first emitting part 410 is positioned between the first electrode 210 and the CGL 490, and the second emitting part 450 is positioned between the second electrode 230 and the CGL 490.

The CGL 490 can be a P-N junction type CGL of an N-type CGL 492 and a P-type CGL 494.

The N-type CGL 492 is positioned between the first ETL 419 and the second HTL 451, and the P-type CGL 494 is positioned between the N-type CGL 492 and the second HTL 451. The N-type CGL 492 provides an electron into the first EML 440 of the first emitting part 410, and the P-type CGL 494 provides a hole into the second EML 480 of the second emitting part 450.

The capping layer 290 is positioned on the second electrode 230. For example, the capping layer 290 can include the material of the HTLs 413 and 451 and can have a thickness of 50 to 200 nm.

The OLED D2 includes the first emitting part 410 and the second emitting part 450, and each of the first and second emitting parts 410 and 450 includes a phosphorescent emitting layer and a fluorescent emitting layer. As a result, the OLED D2 has advantages in the emitting efficiency, the FWHM, i.e., the color purity, and the lifespan.

Figure 5:
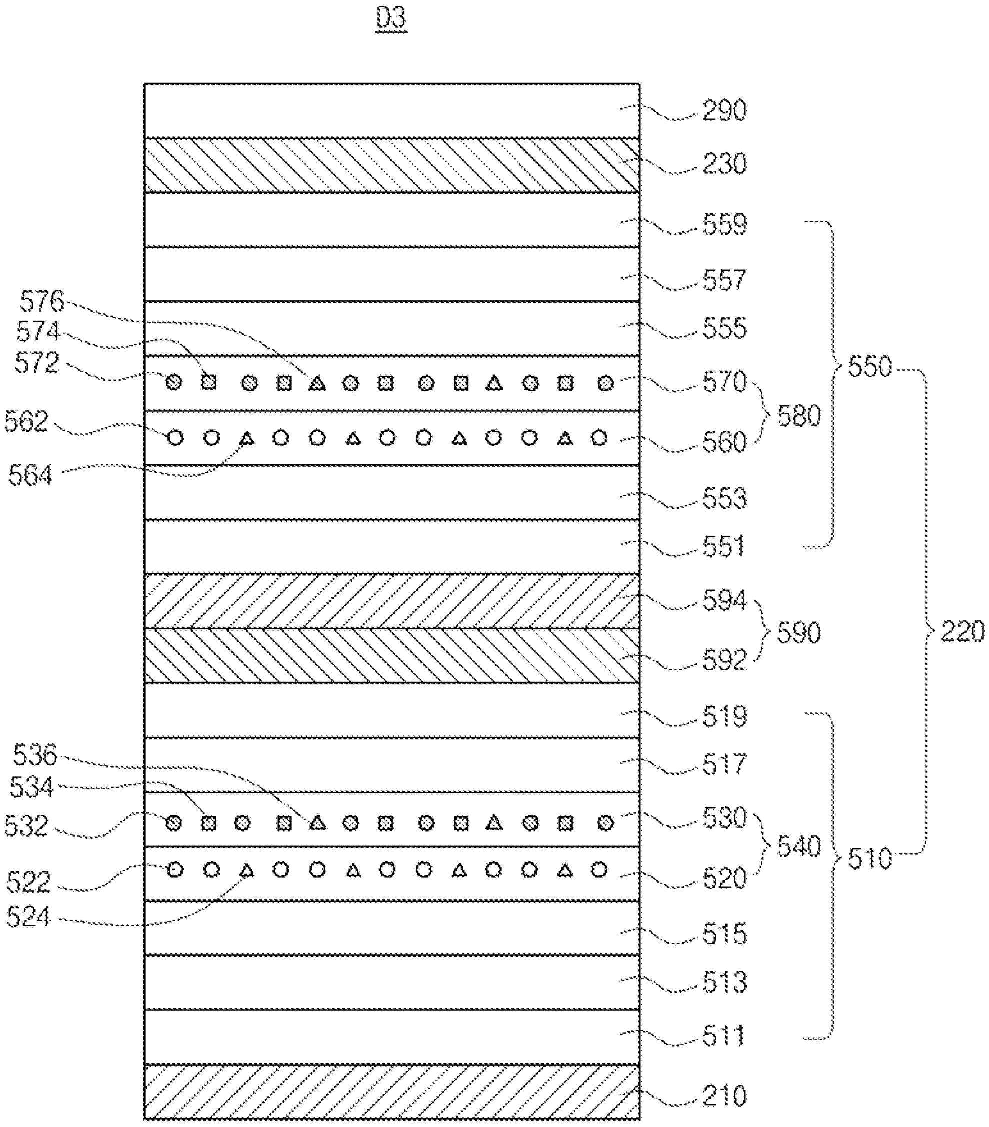
FIG. 5 is a schematic cross-sectional view of an OLED according to a fourth embodiment of the present disclosure.

FIG. 5 is a schematic cross-sectional view of an OLED according to a fourth embodiment of the present disclosure.

As shown in FIG. 5, the OLED D3 includes the first electrode 210 as a reflective electrode, the second electrode 230 as a transparent electrode (or a semi-transparent electrode) facing the first electrode 210, and the organic light emitting layer 220 therebetween. The organic light emitting layer 220 includes a first emitting part 510 including a first EML 540, which includes a first emitting layer 520 and a second emitting layer 530, and a second emitting part 550 including a second EML 580, which includes a third emitting layer 560 and a fourth emitting layer 570. In addition, the organic light emitting layer 220 can further include a CGL 590 between the first and second emitting parts 510 and 550. Moreover, the OLED D1 can further include a capping layer 290 for enhancing (improving) an emitting efficiency.

The organic light emitting display device can include a red pixel region, a green pixel region and a blue pixel region, and the OLED D1 is positioned in the green pixel region.

The first electrode 210 can be anode, and the second electrode 230 can be a cathode. The first electrode 210 is a reflective electrode, and the second electrode 230 is a transparent electrode (or a semi-transparent electrode). For example, the first electrode 210 can have a structure of ITO/Ag/ITO, and the second electrode 230 can be formed of MgAg.

In the first emitting part 510, the first emitting layer 520 is positioned between the first electrode 210 and the second emitting layer 530. Namely, the first emitting layer 510 is disposed to be closer to the first electrode 210, and the second emitting layer 520 is disposed to be closer to the second electrode 230. The first emitting layer 520 is a phosphorescent emitting layer, and the second emitting layer 530 is a fluorescent emitting layer.

In the second emitting part 550, the fourth emitting layer 570 is positioned between the second electrode 230 and the third emitting layer 560. Namely, the third emitting layer 560 is disposed to be closer to the first electrode 210, and the fourth emitting layer 570 is disposed to be closer to the second electrode 230. The third emitting layer 560 is a phosphorescent emitting layer, and the fourth emitting layer 570 is a fluorescent emitting layer. Namely, in the first emitting part 510, the second emitting layer 530 being the fluorescent emitting layer is positioned to be closer to the second electrode 230 being the transparent electrode (or semi-transparent electrode), and in the second emitting part 550, the fourth emitting layer being the fluorescent layer is positioned to be closer to the second electrode 230 being the transparent electrode.

The first emitting layer 520 includes a first compound 522 as a first host and a second compound 524 as a first phosphorescent dopant (or a first phosphorescent emitter). The second emitting layer 530 includes a third compound 532 as a second host, a fourth compound 534 as an auxiliary host (or an auxiliary dopant) and a fifth compound 536 as a first fluorescent dopant (or a first fluorescent emitter). The fourth compound 534 is a delayed fluorescent compound.

The third emitting layer 560 includes a ninth compound 562 as a fourth host and a tenth compound 564 as a second phosphorescent dopant. The fourth emitting layer 570 includes a sixth compound 572 as a third host, a seventh compound 574 as an auxiliary host and an eighth compound 576 as a second fluorescent dopant. The seventh compound 574 is a delayed fluorescent compound.

Each of the first compound 522 as the host of the first emitting layer 520, the third compound 532 as the host of the second emitting layer 530, the sixth compound 572 as the host of the fourth emitting layer 570 and the ninth compound 562 as the host of the third emitting layer 560 is represented by Formula 1-1.

Namely, the first compound 522 as the host of the first emitting layer 520, the third compound 532 as the host of the second emitting layer 530, the sixth compound 572 as the host of the fourth emitting layer 570 and the ninth compound 562 as the host of the third emitting layer 560 have the same chemical structure and can be same or different.

For example, each of the first compound 522 as the host of the first emitting layer 520, the third compound 532 as the host of the second emitting layer 530, the sixth compound 572 as the host of the fourth emitting layer 570 and the ninth compound 562 as the host of the third emitting layer 560 can be represented by one of Formulas 1-2, 1-3 and 1-4. Each of the first compound 522 as the host of the first emitting layer 520, the third compound 532 as the host of the second emitting layer 530, the sixth compound 572 as the host of the fourth emitting layer 570 and the ninth compound 562 as the host of the third emitting layer 560 can be selected from the compounds in Formula 2.

Each of the second compound 524 as the first phosphorescent dopant of the first emitting layer 520 and the tenth compound 564 as the second phosphorescent dopant of the third emitting layer 560 can be an iridium compound represented by Formula 3.

Namely, the second compound 524 as the first phosphorescent dopant of the first emitting layer 520 and the tenth compound 564 as the second phosphorescent dopant of the third emitting layer 560 have the same chemical structure and can be same or different.

For example, each of the second compound 524 as the first phosphorescent dopant of the first emitting layer 520 and the tenth compound 564 as the second phosphorescent dopant of the third emitting layer 560 can be selected from the compounds in Formula 4.

Each of the fourth compound 534 as the auxiliary host of the second emitting layer 530 and the seventh compound 574 as the auxiliary host of the fourth emitting layer 570 can be represented by Formula 5.

Namely, the fourth compound 534 as the auxiliary host of the second emitting layer 530 and the seventh compound 574 as the auxiliary host of the fourth emitting layer 570 have the same chemical structure and can be same or different.

For example, each of the fourth compound 534 as the auxiliary host of the second emitting layer 530 and the seventh compound 574 as the auxiliary host of the fourth emitting layer 570 can be selected from the compounds in Formula 6.

Each of the fifth compound 536 as the first fluorescent dopant of the second emitting layer 530 and the eighth compound 576 as the second fluorescent dopant of the fourth emitting layer 570 can be represented by Formula 7.

Namely, the fifth compound 536 as the first fluorescent dopant of the second emitting layer 530 and the eighth compound 576 as the second fluorescent dopant of the fourth emitting layer 570 have the same chemical structure and can be same or different.

For example, each of the fifth compound 536 as the first fluorescent dopant of the second emitting layer 530 and the eighth compound 576 as the second fluorescent dopant of the fourth emitting layer 570 can be selected from the compounds in Formula 8.

In the first emitting layer 520, a weight % of the first compound 522 is greater than a weight % of the second compound 524. For example, in the first emitting layer 520, the second compound 524 can have 1 to 20 weight % with respect to the first compound 522.

In the second emitting layer 530, a weight % of each of the third and fourth compounds 532 and 534 is greater than a weight % of the fifth compound 536, and the weight % of the third compound 532 can be equal to or greater than the weight % of the fourth compound 534. For example, in the second emitting layer 530, the fourth compound 534 can have 60 to 80 weight % with respect to the third compound 532, and the fifth compound 536 can have 0.1 to 10 weight % with respect to the third compound 532.

In the third emitting layer 560, a weight % of the ninth compound 562 is greater than a weight % of the tenth compound 564. For example, in the third emitting layer 560, the tenth compound 564 can have 1 to 20 weight % with respect to the ninth compound 562.

In the fourth emitting layer 570, a weight % of each of the sixth and seventh compounds 572 and 574 is greater than a weight % of the eighth compound 576, and the weight % of the sixth compound 572 can be equal to or greater than the weight % of the seventh compound 574. For example, in the fourth emitting layer 570, the seventh compound 574 can have 60 to 80 weight % with respect to the sixth compound 572, and the eighth compound 576 can have 0.1 to 10 weight % with respect to the sixth compound 572.

Each of the first to fourth emitting layers 520, 530, 560 and 570 can have a thickness of about 10 to 25 nm. The first to fourth emitting layers 520, 530, 560 and 570 can have the same thickness or different thicknesses.

In the second emitting layer 530, a difference between an LUMO energy level of the fifth compound 536 "FD" as the first fluorescent dopant and an LUMO energy level of the fourth compound 534 "TD" as the auxiliary host can be −0.6 eV or more and 0.1 eV or less. (0.1 eV≥LUMO (FD)−LUMO(TD)≥−0.6 eV) In the fourth emitting layer 570, a difference between an LUMO energy level of the eighth compound 576 "FD" as the second fluorescent dopant and an LUMO energy level of the seventh compound 574 "TD" as the auxiliary host can be −0.6 eV or more and 0.1 eV or less. (0.1 eV≥LUMO (FD)−LUMO(TD)≥−0.6 eV) As a result, the generation of the exciplex in each of the second and fourth emitting layers 530 and 570 can be prevented, and the emitting efficiency of each of the second and fourth emitting layers 530 and 570 can be improved.

A difference between a maximum emission wavelength of the first emitting layer 520 and a maximum emission wavelength of the second emitting layer 530 is 20 nm or less, and a difference between a maximum emission wavelength of the third emitting layer 560 and a maximum emission wavelength of the fourth emitting layer 570 is 20 nm or less. Namely, a difference between a maximum emission wavelength of the fifth compound 536 in the second emitting layer 530 and a maximum emission wavelength of the second compound 524 in the first emitting layer 520 is 20 nm or less, and a difference between a maximum emission wavelength of the eighth compound 576 in the fourth emitting layer 570 and a maximum emission wavelength of the tenth compound 564 in the third emitting layer 560 is 20 nm or less. For example, each of the first to fourth emitting layers 520, 530, 560 and 570 can have an emission wavelength range of 510 to 540 nm.

In addition, a difference between an average emission wavelength of the first emitting part 510 including the first and second emitting layers 520 and 530 and an average emission wavelength of the second emitting part 550 including the third and fourth emitting layers 560 and 570 can be 20 nm or less.

In the first EML 540, an intensity of a second emission peak of the second emitting layer 530, which is closer to the second electrode 230 being the transparent electrode than the first emitting layer 520, is equal to or smaller than an intensity of a second emission peak of the first emitting layer 520. Namely, in the first EML 540, the intensity of the second emission peak of the fifth compound 536 as an emitter in the second emitting layer 530 is equal to or smaller than the intensity of the second emission peak of the second compound 524 as an emitter in the first emitting layer 520. In the first EML 540, it is preferred that the intensity of the second emission peak of the second emitting layer 530 is smaller than the intensity of the second emission peak of the first emitting layer 520.

In the second EML 580, an intensity of a second emission peak of the fourth emitting layer 570, which is closer to the second electrode 230 being the transparent electrode than the third emitting layer 560, is equal to or smaller than an intensity of a second emission peak of the third emitting layer 560. Namely, in the second EML 580, the intensity of the second emission peak of the eighth compound 576 as an emitter in the fourth emitting layer 570 is equal to or smaller than the intensity of the second emission peak of the tenth compound 564 as an emitter in the third emitting layer 560. In the second EML 580, it is preferred that the intensity of the second emission peak of the fourth emitting layer 570 is smaller than the intensity of the second emission peak of the third emitting layer 560.

Referring to FIGS. 6A to 6E, which are a PL spectrum of the phosphorescent dopants, i.e., the compounds PD1 and PD2 in Formula 4, and the fluorescent dopants, i.e., the compounds FD1, FD2 and FD3 in Formula 8, the second emission peak of each of the compounds PD1 and PD2, which can be the second compound 524 of the first emitting layer 520 and the tenth compound 564 of the third emitting layer 560, is greater than the second emission peak of each of the compounds FD1, FD2 and FD3, which can be the fifth compound 536 of the second emitting layer 530 and the eighth compound 576 of the fourth emitting layer 570.

As a result, the cavity effect in the OLED D3 is enhanced or intensified such that the emitting efficiency and the color purity are significantly improved.

In the second compound 524 of the first emitting layer 520, a ratio of a second emission peak intensity "$I_{2nd}$" to a first emission peak intensity "$I_{1st}$" is 0.55 or more and less than 1. ($0.55 \le (I_{2nd}/I_{1st}) < 1.0$) In addition, in the tenth compound 564 of the third emitting layer 560, a ratio of a second emission peak intensity "$I_{2nd}$" to a first emission peak intensity "list" is 0.55 or more and less than 1. ($0.55 \le (I_{2nd}/I_{1st}) < 1.0$) Accordingly, the emitting efficiency (luminance) of the OLED D3 is significantly increased. The first emission peak means the emission peak formed at relatively shorter wavelength ranges among plural emission peaks, and the second emission peak means the emission peak formed at relatively longer wavelength ranges among plural emission peaks.

Figure 6A:
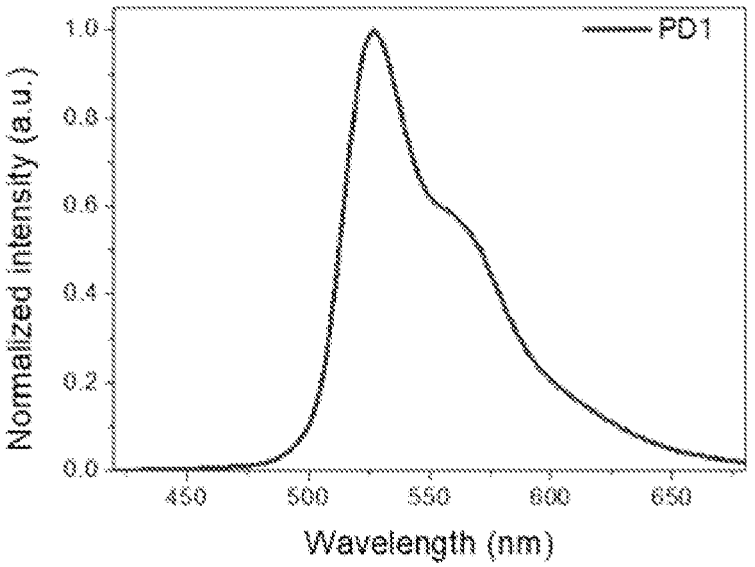
FIGS. 6A to 6E are a PL spectrum of emitters (dopants) used for am OLED of the present disclosure.
Figure 6B:
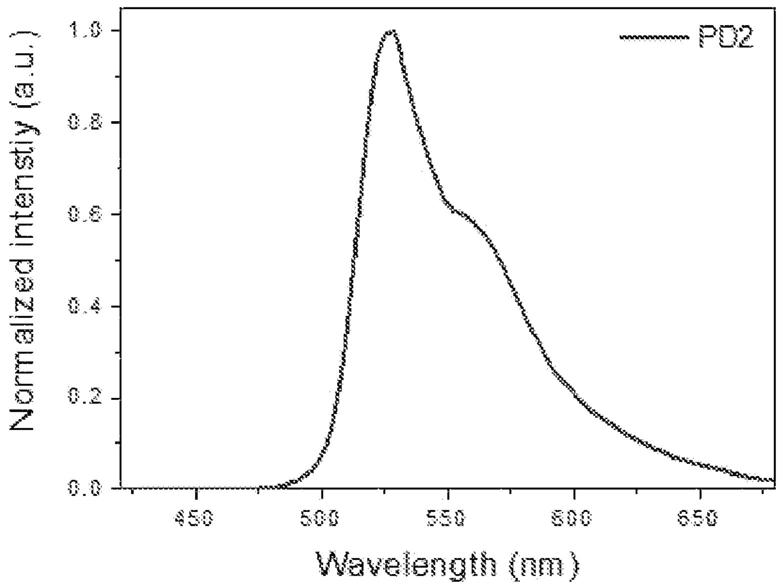
Figure 6C:
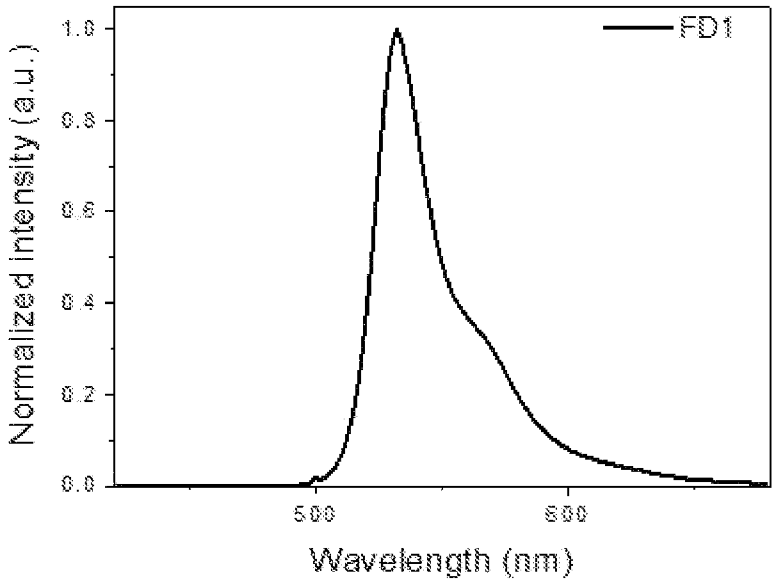
Figure 6D:
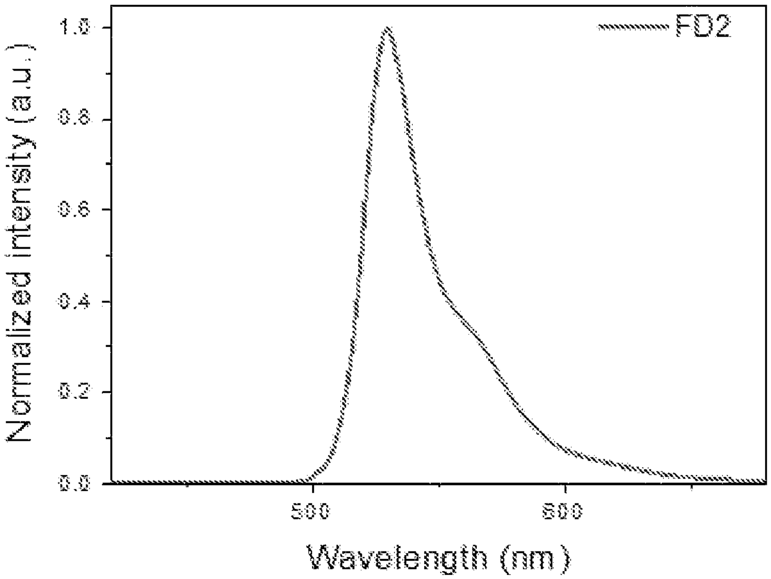
Figure 6E:
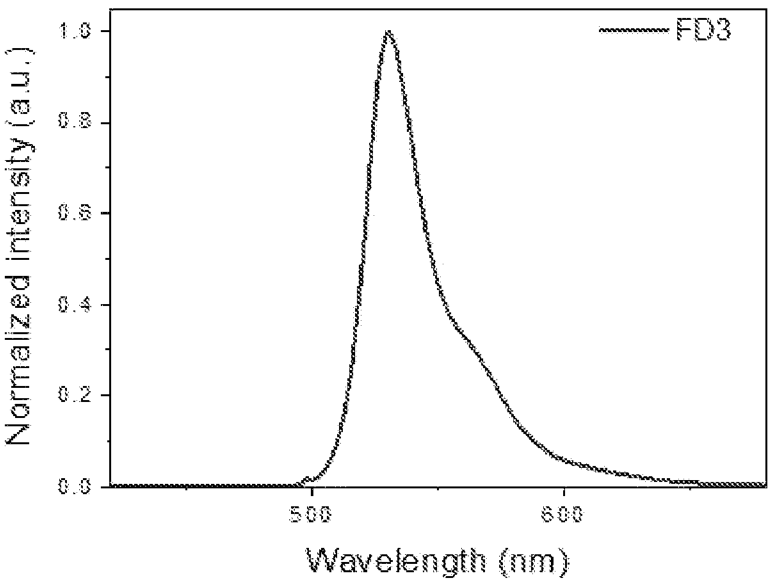

Referring to FIGS. 6A and 6B, in the compounds PD1 and PD2, which can be the second compound 524 of the first light emitting layer 520 and the tenth compound 564 of the third light emitting layer 560, the ratio of the second emission peak intensity "$I_{2nd}$" to the first emission peak intensity "$I_{1st}$" is about 0.57 and about 0.6, respectively.

The first emitting part 510 can further include at least one of a first HTL 513 positioned under the first EML 540 and a first ETL 519 positioned on the first EML 540.

In addition, the first emitting part 510 can further include an HIL positioned under the first HTL 513.

Moreover, the first emitting part 510 can further include at least one of a first EBL 515 positioned between the first EML 540 and the first HTL 513 and a first HBL 517 positioned between the first EML 540 and the first ETL 519.

The second emitting part 550 can further include at least one of a second HTL 551 positioned under the second EML 580 and a second ETL 557 positioned on the second EML 580.

In addition, the second emitting part 550 can further include an EIL positioned on the second ETL 557.

Moreover, the second emitting part 550 can further include at least one of a second EBL 553 positioned between the second EML 580 and the second HTL 551 and a second HBL 555 positioned between the second EML 580 and the second ETL 557.

The CGL 590 is positioned between the first and second emitting parts 510 and 550, and the first and second emitting parts 510 and 550 are connected through the CGL 590. The first emitting part 510, the CGL 590 and the second emitting part 550 are sequentially stacked on the first electrode 210. Namely, the first emitting part 510 is positioned between the first electrode 210 and the CGL 590, and the second emitting part 550 is positioned between the second electrode 230 and the CGL 590.

The CGL 590 can be a P-N junction type CGL of an N-type CGL 592 and a P-type CGL 594.

The N-type CGL 592 is positioned between the first ETL 519 and the second HTL 551, and the P-type CGL 594 is positioned between the N-type CGL 592 and the second HTL 551. The N-type CGL 592 provides an electron into the first EML 540 of the first emitting part 510, and the P-type CGL 594 provides a hole into the second EML 580 of the second emitting part 550.

The capping layer 290 is positioned on the second electrode 230. For example, the capping layer 290 can include the material of the HTLs 513 and 551 and can have a thickness of 50 to 200 nm.

The OLED D3 includes the first emitting part 510 and the second emitting part 550, and each of the first and second emitting parts 510 and 550 includes a phosphorescent emitting layer and a fluorescent emitting layer. As a result, the OLED D3 has advantages in the emitting efficiency, the FWHM, i.e., the color purity, and the lifespan.

Figure 7:
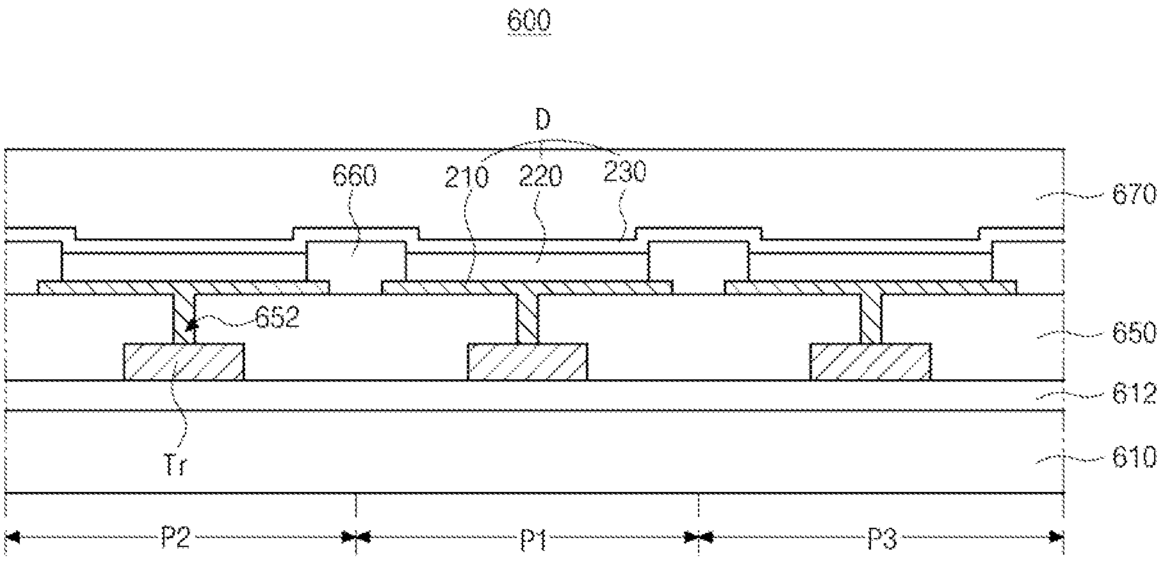
FIG. 7 is a schematic cross-sectional view of an organic light emitting display device according to a fifth embodiment of the present disclosure.

FIG. 7 is a schematic cross-sectional view of an organic light emitting display device according to a fifth embodiment of the present disclosure.

As shown in FIG. 7, the organic light emitting display device 600 includes a substrate 610, wherein first to third pixel regions P1, P2 and P3 are defined, a TFT Tr over the substrate 610 and an OLED D. The OLED D is disposed over the TFT Tr and is connected to the TFT Tr.

For example, the first to third pixel regions P1, P2 and P3 can be a green pixel region, a red pixel region and a blue pixel region, respectively. The first to third pixel regions P1, P2 and P3 constitute a pixel unit. Alternatively, the pixel unit can further include a white pixel region.

The substrate 610 can be a glass substrate or a flexible substrate.

A buffer layer 612 is formed on the substrate 610, and the TFT Tr is formed on the buffer layer 612. In some embodiments, the buffer layer 612 can be omitted.

The TFT Tr is positioned on the buffer layer 612. The TFT Tr includes a semiconductor layer, a gate electrode, a source electrode and a drain electrode and acts as a driving element. Namely, the TFT Tr can be the driving TFT Td (of FIG. 1).

A planarization layer (or passivation layer) 650 is formed on the TFT Tr. The planarization layer 650 has a flat top surface and includes a drain contact hole 652 exposing the drain electrode of the TFT Tr.

The OLED D is disposed on the planarization layer 650 and includes a first electrode 210, an organic light emitting layer 220 and a second electrode 230. The first electrode 210 is connected to the drain electrode of the TFT Tr, and the organic light emitting layer 220 and the second electrode 230 are sequentially stacked on the first electrode 240. The OLED D is disposed in each of the first to third pixel regions P1 to P3 and emits different color light in the first to third pixel regions P1 to P3. For example, the OLED D in the first pixel region P1 can emit the green light, the OLED D in the second pixel region P2 can emit the red light, and the OLED D in the third pixel region P3 can emit the blue light.

The first electrode 210 is formed to be separate in the first to third pixel regions P1 to P3, and the second electrode 230 is formed as one-body to cover the first to third pixel regions P1 to P3.

The first electrode 210 is one of an anode and a cathode, and the second electrode 230 is the other one of the anode and the cathode. In addition, the first electrode 210 is a reflective electrode, and the second electrode 230 is a transparent electrode (or a semi-transparent electrode). Namely, the light from the OLED D passes through the second electrode 230 to display an image. (i.e., a top-emission type organic light emitting display device)

For example, the first electrode 210 can be an anode and can include a transparent conductive oxide material layer, which can be formed of a conductive material, e.g., a transparent conductive oxide (TCO), having a relatively high work function, and a reflection layer. Namely, the first electrode 210 can be a reflective electrode.

The second electrode 230 can a cathode and can be formed of a conductive material having a relatively low work function. The second electrode 230 can have a thin profile to be transparent (or semi-transparent).

The organic light emitting layer 220 can have a structure explained with FIGS. 3 to 5.

Referring to FIG. 3, the organic light emitting layer 220 includes a first emitting part 310 including a first EML 340, which includes first and second emitting layers 320 and 330, and a second emitting part 350 including a second EML 380, which includes third and fourth emitting layers 360 and 370.

In the first emitting part 310, the first emitting layer 320 is positioned between the first electrode 210 and the second emitting layer 330. The first emitting layer 320 is a phosphorescent emitting layer, and the second emitting layer 330 is a fluorescent emitting layer. In the second emitting part 350, the fourth emitting layer 370 is positioned between the second electrode 230 and the third emitting layer 360. The third emitting layer 360 is a fluorescent emitting layer, and the fourth emitting layer 370 is a phosphorescent emitting layer. Namely, in the first emitting part 310, the second emitting layer 330 being the fluorescent emitting layer is positioned to be closer to the second electrode 230 being the transparent electrode (or semi-transparent electrode), while in the second emitting part 350, the fourth emitting layer being the phosphorescent layer is positioned to be closer to the second electrode 230 being the transparent electrode.

The first emitting layer 320 includes a first compound 322 as a first host and a second compound 324 as a first phosphorescent dopant (or a first phosphorescent emitter). The second emitting layer 330 includes a third compound 332 as a second host, a fourth compound 334 as an auxiliary host (or an auxiliary dopant) and a fifth compound 336 as a first fluorescent dopant (or a first fluorescent emitter). The fourth compound 334 is a delayed fluorescent compound.

The third emitting layer 360 includes a sixth compound 362 as a third host, a seventh compound 364 as an auxiliary host and an eighth compound 366 as a second fluorescent dopant. The seventh compound 364 is a delayed fluorescent compound. The fourth emitting layer 370 includes a ninth compound 372 as a fourth host and a tenth compound 374 as a second phosphorescent dopant.

Each of the first compound 322 as the host of the first emitting layer 320, the third compound 332 as the host of the second emitting layer 330, the sixth compound 362 as the host of the third emitting layer 360 and the ninth compound 372 as the host of the fourth emitting layer 370 is represented by Formula 1-1. Each of the second compound 324 as the first phosphorescent dopant of the first emitting layer 320 and the tenth compound 374 as the second phosphorescent dopant of the fourth emitting layer 370 is an iridium compound represented by Formula 3. Each of the fourth compound 334 as the auxiliary host of the second emitting layer 330 and the seventh compound 364 as the auxiliary host of the third emitting layer 360 is represented by Formula 5. Each of the fifth compound 336 as the first fluorescent dopant of the second emitting layer 330 and the eighth compound 366 as the second fluorescent dopant of the third emitting layer 360 is represented by Formula 7.

Referring to FIG. 4, the organic light emitting layer 220 includes a first emitting part 410 including a first EML 440, which includes a first emitting layer 420 and a second emitting layer 430, and a second emitting part 450 including a second EML 480, which includes a third emitting layer 460 and a fourth emitting layer 470.

In the first emitting part 410, the first emitting layer 420 is positioned between the first electrode 210 and the second emitting layer 430. The first emitting layer 420 is a fluorescent emitting layer, and the second emitting layer 430 is a phosphorescent emitting layer. In the second emitting part 450, the fourth emitting layer 470 is positioned between the second electrode 230 and the third emitting layer 460. The third emitting layer 460 is a phosphorescent emitting layer, and the fourth emitting layer 470 is a fluorescent emitting layer. Namely, in the first emitting part 410, the second emitting layer 430 being the phosphorescent emitting layer is positioned to be closer to the second electrode 230 being the transparent electrode (or semi-transparent electrode), while in the second emitting part 450, the fourth emitting layer being the fluorescent layer is positioned to be closer to the second electrode 230 being the transparent electrode.

The first emitting layer 420 includes a third compound 422 as a second host, a fourth compound 424 as an auxiliary host (or an auxiliary dopant) and a fifth compound 426 as a first fluorescent dopant (or a first fluorescent emitter). The second emitting layer 430 includes a first compound 432 as a first host and a second compound 434 as a first phosphorescent dopant (or a first phosphorescent emitter). The fourth compound 424 is a delayed fluorescent compound.

The third emitting layer 460 includes a ninth compound 462 as a fourth host and a tenth compound 464 as a second phosphorescent dopant. The fourth emitting layer 470 includes a sixth compound 472 as a third host, a seventh compound 474 as an auxiliary host and an eighth compound 476 as a second fluorescent dopant. The seventh compound 474 is a delayed fluorescent compound.

Each of the first compound 432 as the host of the second emitting layer 430, the third compound 422 as the host of the first emitting layer 420, the sixth compound 472 as the host of the fourth emitting layer 470 and the ninth compound 462 as the host of the third emitting layer 460 is represented by Formula 1-1. Each of the second compound 343 as the first phosphorescent dopant of the second emitting layer 430 and the tenth compound 436 as the second phosphorescent dopant of the third emitting layer 460 can be an iridium compound represented by Formula 3. Each of the fourth compound 424 as the auxiliary host of the first emitting layer 420 and the seventh compound 474 as the auxiliary host of the fourth emitting layer 470 can be represented by Formula 5. Each of the fifth compound 426 as the first fluorescent dopant of the first emitting layer 420 and the eighth compound 476 as the second fluorescent dopant of the fourth emitting layer 470 can be represented by Formula 7.

Referring to FIG. 5, the organic light emitting layer 220 includes a first emitting part 510 including a first EML 540, which includes a first emitting layer 520 and a second emitting layer 530, and a second emitting part 550 including a second EML 580, which includes a third emitting layer 560 and a fourth emitting layer 570.

In the first emitting part 510, the first emitting layer 520 is positioned between the first electrode 210 and the second emitting layer 530. The first emitting layer 520 is a phosphorescent emitting layer, and the second emitting layer 530 is a fluorescent emitting layer. In the second emitting part 550, the fourth emitting layer 570 is positioned between the second electrode 230 and the third emitting layer 560. The third emitting layer 560 is a phosphorescent emitting layer, and the fourth emitting layer 570 is a fluorescent emitting layer. Namely, in the first emitting part 510, the second emitting layer 530 being the fluorescent emitting layer is positioned to be closer to the second electrode 230 being the transparent electrode (or semi-transparent electrode), and in the second emitting part 550, the fourth emitting layer being the fluorescent layer is positioned to be closer to the second electrode 230 being the transparent electrode.

The first emitting layer 520 includes a first compound 522 as a first host and a second compound 524 as a first phosphorescent dopant (or a first phosphorescent emitter). The second emitting layer 530 includes a third compound 532 as a second host, a fourth compound 534 as an auxiliary host (or an auxiliary dopant) and a fifth compound 536 as a first fluorescent dopant (or a first fluorescent emitter). The fourth compound 534 is a delayed fluorescent compound.

The third emitting layer 560 includes a ninth compound 562 as a fourth host and a tenth compound 564 as a second phosphorescent dopant. The fourth emitting layer 570 includes a sixth compound 572 as a third host, a seventh compound 574 as an auxiliary host and an eighth compound 576 as a second fluorescent dopant. The seventh compound 574 is a delayed fluorescent compound.

Each of the first compound 522 as the host of the first emitting layer 520, the third compound 532 as the host of the second emitting layer 530, the sixth compound 572 as the host of the fourth emitting layer 570 and the ninth compound 562 as the host of the third emitting layer 560 is represented by Formula 1-1. Each of the second compound 524 as the first phosphorescent dopant of the first emitting layer 520 and the tenth compound 564 as the second phosphorescent dopant of the third emitting layer 560 can be an iridium compound represented by Formula 3. Each of the fourth compound 534 as the auxiliary host of the second emitting layer 530 and the seventh compound 574 as the auxiliary host of the fourth emitting layer 570 can be represented by Formula 5. Each of the fifth compound 536 as the first fluorescent dopant of the second emitting layer 530 and the eighth compound 576 as the second fluorescent dopant of the fourth emitting layer 570 can be represented by Formula 7.

In some embodiments, the OLED D can further include the capping layer on the second electrode 230. The emitting efficiency of the OLED D can be further improved by the capping layer.

An encapsulation film (or an encapsulation layer) 670 is formed on the second electrode 230 to prevent penetration of moisture into the OLED D. The encapsulation film 670 can have a structure including an inorganic insulating layer and an organic insulating layer.

In some embodiments, the organic light emitting display device 600 can include a color filter corresponding to the red, green and blue pixel regions. For example, the color filter can be positioned on or over the OLED D or the encapsulation film 670.

In addition, the organic light emitting display device 600 can further include a cover window on or over the encapsulation film 670 or the color filter. In this instance, the substrate 610 and the cover window have a flexible property such that a flexible organic light emitting display device can be provided.

Figure 8:
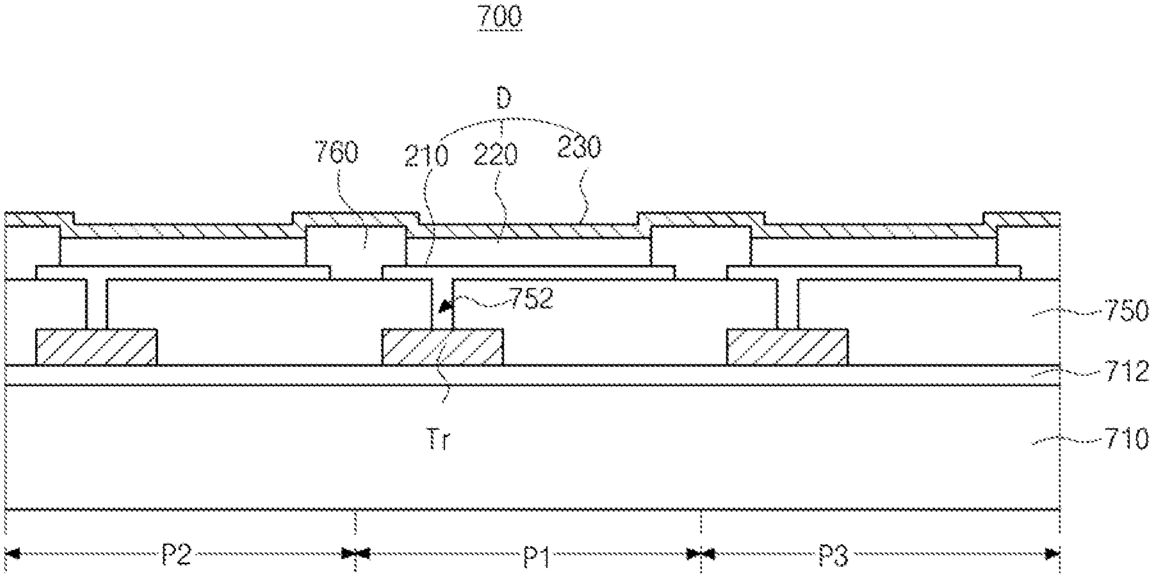
FIG. 8 is a schematic cross-sectional view of an organic light emitting display device according to a sixth embodiment of the present disclosure.

FIG. 8 is a schematic cross-sectional view of an organic light emitting display device according to a sixth embodiment of the present disclosure.

As shown in FIG. 8, the organic light emitting display device 700 includes a substrate 710, wherein first to third pixel regions P1, P2 and P3 are defined, a TFT Tr over the substrate 710 and an OLED D. The OLED D is disposed over the TFT Tr and is connected to the TFT Tr.

For example, the first to third pixel regions P1, P2 and P3 can be a green pixel region, a red pixel region and a blue pixel region, respectively. The first to third pixel regions P1, P2 and P3 constitute a pixel unit. Alternatively, the pixel unit can further include a white pixel region.

The substrate 710 can be a glass substrate or a flexible substrate.

A buffer layer 712 is formed on the substrate 710, and the TFT Tr is formed on the buffer layer 712. In some embodiments, the buffer layer 712 can be omitted.

The TFT Tr is positioned on the buffer layer 712. The TFT Tr includes a semiconductor layer, a gate electrode, a source electrode and a drain electrode and acts as a driving element. Namely, the TFT Tr can be the driving TFT Td (of FIG. 1).

A planarization layer (or passivation layer) 750 is formed on the TFT Tr. The planarization layer 750 has a flat top surface and includes a drain contact hole 752 exposing the drain electrode of the TFT Tr.

The OLED D is disposed on the planarization layer 750 and includes a first electrode 210, an organic light emitting layer 220 and a second electrode 230. The first electrode 210 is connected to the drain electrode of the TFT Tr, and the organic light emitting layer 220 and the second electrode 230 are sequentially stacked on the first electrode 240. The OLED D is disposed in each of the first to third pixel regions P1 to P3 and emits different color light in the first to third pixel regions P1 to P3. For example, the OLED D in the first pixel region P1 can emit the green light, the OLED D in the second pixel region P2 can emit the red light, and the OLED D in the third pixel region P3 can emit the blue light.

The first electrode 210 is formed to be separate in the first to third pixel regions P1 to P3, and the second electrode 230 is formed as one-body to cover the first to third pixel regions P1 to P3.

The first electrode 210 is one of an anode and a cathode, and the second electrode 230 is the other one of the anode and the cathode. In addition, the first electrode 210 is a transparent electrode (or a semi-transparent electrode), and the second electrode 230 is a reflective electrode. Namely, the light from the OLED D passes through the first electrode 210 to display an image on the substrate 710 (i.e., a bottom-emission type organic light emitting display device).

For example, the first electrode 210 can be an anode and can include a conductive material, e.g., a transparent conductive oxide (TCO), having a relatively high work function, and a reflection layer.

The second electrode 230 can a cathode and can be formed of a conductive material having a relatively low work function.

The organic light emitting layer 220 can have a structure explained with FIGS. 3 to 5, but the stack order of the first emitting layers 320, 420 and 520 and the second emitting layers 330, 430 and 530 and the stack order of the third emitting layers 360, 460 and 560 and the fourth emitting layers 370, 470 and 570 are changed.

For example, in the OLED D3 of FIG. 5, in the first EML 540, the second emitting layer 530, which is a fluorescent emitting layer, is positioned to be closer to the first electrode 210, which is a transparent electrode, than the first emitting layer 520. In the second EML 580, the fourth emitting layer 570, which is a fluorescent emitting layer, is positioned to be closer to the first electrode 210, which is a transparent electrode, than the third emitting layer 560.

An encapsulation film (or an encapsulation layer) 770 is formed on the second electrode 230 to prevent penetration of moisture into the OLED D. The encapsulation film 770 can have a structure including an inorganic insulating layer and an organic insulating layer.

In some embodiments, the organic light emitting display device 700 can include a color filter corresponding to the red, green and blue pixel regions. For example, the color filter can be positioned between the OLED D and the substrate 710.

EXAMPLES

The following examples are not intended to be limiting. The above disclosure provides many different embodiments for implementing the features of the invention, and the following examples describe certain embodiments. It will be appreciated that other modifications and methods known to one of ordinary skill in the art can also be applied to the following experimental procedures, without departing from the scope of the invention.

[OLED1]

An anode (ITO/APC/ITO), an HIL (Formula 9-1, 5 nm), an HTL (Formula 9-2, 25 nm), an EBL (Formula 9-3, 10 nm), an EML (30 nm), an HBL (Formula 9-4, 10 nm), an ETL (Formula 9-5, 30 nm), an EIL (LiF, 3 nm), a cathode (Al, 20 nm) and a capping layer (Formula 9-6, 100 nm) are sequentially deposited to form an OLED in the green pixel region.

[Formula 9-1]

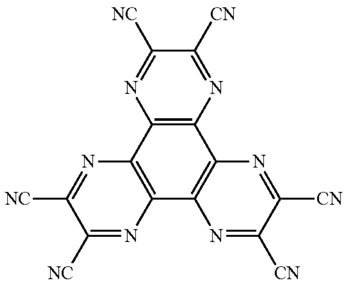

HAT-CN

-continued

[Formula 9-2]

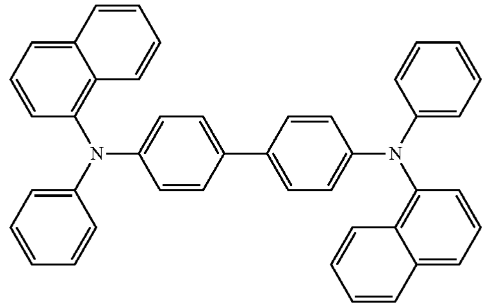

NPB

[Formula 9-3]

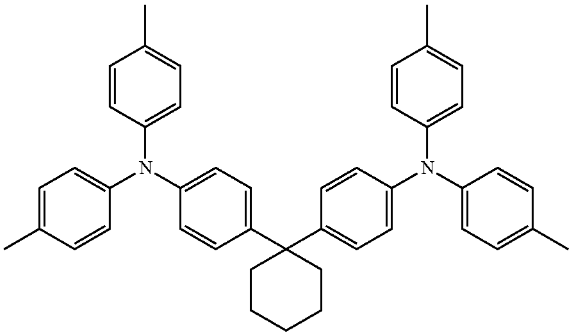

TAPC

[Formula 9-4]

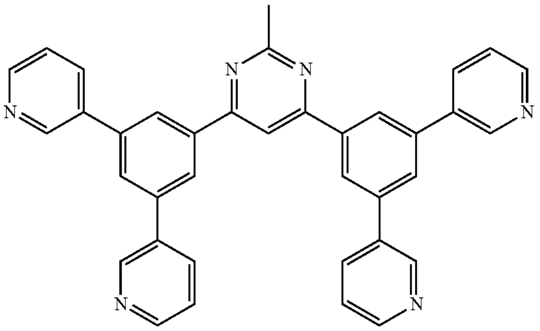

B3PYMPM

[Formula 9-5]

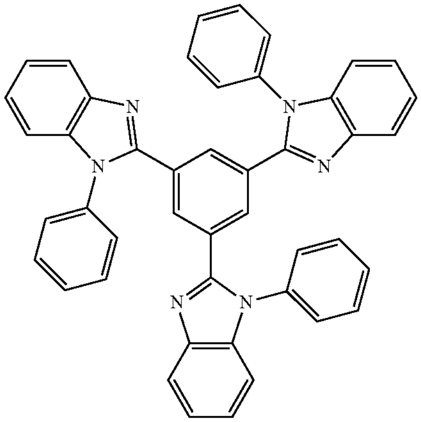

TPBi

-continued

[Formula 9-6]

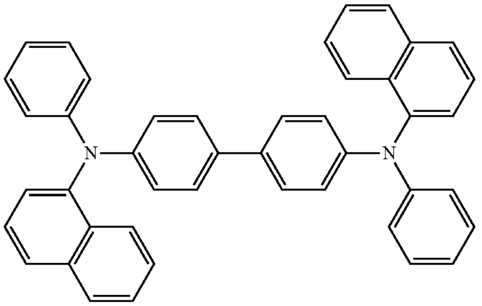

1. Comparative Examples

(1) Comparative Example 1 (Ref1)

The compound H1 in Formula 2 (92 wt. %) and the compound PD1 in Formula 4 (8 wt. %) were used to form the EML.

(2) Comparative Example 2 (Ref2)

The compound H1 in Formula 2 (92 wt. %) and the compound PD2 in Formula 4 (8 wt. %) are used to form the EML.

(3) Comparative Example 3 (Ref3)

The compound H1 in Formula 2 (60 wt. %), the compound TD1 in Formula 6 (39.8 wt. %) and the compound FD1 in Formula 8 (0.2 wt. %) were used to form the EML.

(4) Comparative Example 4 (Ref4)

The compound H1 in Formula 2 (60 wt. %), the compound TD1 in Formula 6 (39.8 wt. %) and the compound FD2 in Formula 8 (0.2 wt. %) were used to form the EML.

(5) Comparative Example 5 (Ref5)

The compound H1 in Formula 2 (60 wt. %), the compound TD1 in Formula 6 (39.8 wt. %) and the compound FD3 in Formula 8 (0.2 wt. %) were used to form the EML.

[OLED2]

An anode (ITO/APC/ITO), an HIL (Formula 9-1, 5 nm), an HTL (Formula 9-2, 25 nm), an EBL (Formula 9-3, 10 nm), a first EML (30 nm), an HBL (Formula 9-4, 10 nm), an ETL (Formula 9-5, 15 nm), an N-type CGL (Formula 9-7 (99.5 wt. %)+Li (0.5 wt. %), 10 nm), a P-type CGL (Formula 9-1, 8 nm), an HTL (Formula 9-2, 25 nm), an EBL (Formula 9-3, 10 nm), a second EML (30 nm), an HBL (Formula 9-4, 10 nm), an ETL (Formula 9-5, 30 nm), an EIL (LiF, 3 nm), a cathode (Al, 20 nm) and a capping layer (Formula 9-6, 100 nm) are sequentially deposited to form an OLED in the green pixel region.

[Formula 9-7]

TAZ

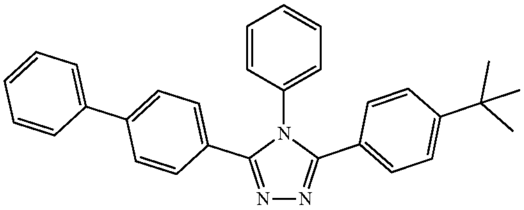

2. Comparative Examples

(1) Comparative Example 6 (Ref6)

The compound H1 in Formula 2 (60 wt. %), the compound TD1 in Formula 6 (39.8 wt. %) and the compound FD1 in Formula 8 (0.2 wt. %) are used to form the first EML, and the compound H1 in Formula 2 (92 wt. %) and the compound PD1 in Formula 4 (8 wt. %) were used to form the second EML.

(2) Comparative Example 7 (Ref7)

The compound H1 in Formula 2 (92 wt. %) and the compound PD1 in Formula 4 (8 wt. %) are used to form the first EML, and the compound H1 in Formula 2 (60 wt. %), the compound TD1 in Formula 6 (39.8 wt. %) and the compound FD1 in Formula 8 (0.2 wt. %) were used to form the second EML.

[OLED3]

An anode (ITO/APC/ITO), an HIL (Formula 9-1, 5 nm), an HTL (Formula 9-2, 25 nm), an EBL (Formula 9-3, 10 nm), a first emitting layer (15 nm), a second emitting layer (15 nm), an HBL (Formula 9-4, 10 nm), an ETL (Formula 9-5, 15 nm), an N-type CGL (Formula 9-7 (99.5 wt. %)+Li (0.5 wt. %), 10 nm), a P-type CGL (Formula 9-1, 8 nm), an HTL (Formula 9-2, 25 nm), an EBL (Formula 9-3, 10 nm), a third emitting layer (15 nm), a fourth emitting layer (15 nm), an HBL (Formula 9-4, 10 nm), an ETL (Formula 9-5, 30 nm), an EIL (LiF, 3 nm), a cathode (Al, 20 nm) and a capping layer (Formula 9-6, 100 nm) are sequentially deposited to form an OLED in the green pixel region.

3. Examples

(1) Example 1 (Ex1)

The compound H1 in Formula 2 (92 wt. %) and the compound PD1 in Formula 4 (8 wt. %, $I_{2nd}/I_{1st}$=0.4) are used to form the first emitting layer, and the compound H1 in Formula 2 (60 wt. %), the compound TD1 in Formula 6 (39.8 wt. %) and the compound FD1 in Formula 8 (0.2 wt. %) are used to form the second emitting layer. The compound H1 in Formula 2 (92 wt. %) and the compound PD1 in Formula 4 (8 wt. %, $I_{2nd}/I_{1st}$=0.4) are used to form the third emitting layer, and the compound H1 in Formula 2 (60 wt. %), the compound TD1 in Formula 6 (39.8 wt. %) and the compound FD1 in Formula 8 (0.2 wt. %) are used to form the fourth emitting layer.

(2) Example 2 (Ex2)

The compound H1 in Formula 2 (92 wt. %) and the compound PD1 in Formula 4 (8 wt. %, $I_{2nd}/I_{1st}$=0.5) are used to form the first emitting layer, and the compound H1 in Formula 2 (60 wt. %), the compound TD1 in Formula 6 (39.8 wt. %) and the compound FD1 in Formula 8 (0.2 wt. %) are used to form the second emitting layer. The compound H1 in Formula 2 (92 wt. %) and the compound PD1 in Formula 4 (8 wt. %, $I_{2nd}/I_{1st}$=0.5) are used to form the third emitting layer, and the compound H1 in Formula 2 (60 wt. %), the compound TD1 in Formula 6 (39.8 wt. %) and the compound FD1 in Formula 8 (0.2 wt. %) are used to form the fourth emitting layer.

(3) Example 3 (Ex3)

The compound H1 in Formula 2 (92 wt. %) and the compound PD1 in Formula 4 (8 wt. %, $I_{2nd}/I_{1st}$=0.7) are used to form the first emitting layer, and the compound H1 in Formula 2 (60 wt. %), the compound TD1 in Formula 6 (39.8 wt. %) and the compound FD1 in Formula 8 (0.2 wt. %) are used to form the second emitting layer. The compound H1 in Formula 2 (92 wt. %) and the compound PD1 in Formula 4 (8 wt. %, $I_{2nd}/I_{1st}$=0.7) are used to form the third emitting layer, and the compound H1 in Formula 2 (60 wt. %), the compound TD1 in Formula 6 (39.8 wt. %) and the compound FD1 in Formula 8 (0.2 wt. %) are used to form the fourth emitting layer.

(4) Example 4 (Ex4)

The compound H1 in Formula 2 (92 wt. %) and the compound PD1 in Formula 4 (8 wt. %, $I_{2nd}/I_{1st}$=0.57) are used to form the first emitting layer, and the compound H1 in Formula 2 (60 wt. %), the compound TD1 in Formula 6 (39.8 wt. %) and the compound FD1 in Formula 8 (0.2 wt. %) are used to form the second emitting layer. The compound H1 in Formula 2 (92 wt. %) and the compound PD1 in Formula 4 (8 wt. %, $I_{2nd}/I_{1st}$=0.57) are used to form the third emitting layer, and the compound H1 in Formula 2 (60 wt. %), the compound TD1 in Formula 6 (39.8 wt. %) and the compound FD1 in Formula 8 (0.2 wt. %) were used to form the fourth emitting layer.

(5) Example 5 (Ex5)

The compound H1 in Formula 2 (60 wt. %), the compound TD1 in Formula 6 (39.8 wt. %) and the compound FD1 in Formula 8 (0.2 wt. %) are used to form the first emitting layer, and the compound H1 in Formula 2 (92 wt. %) and the compound PD1 in Formula 4 (8 wt. %, $I_{2nd}/I_{1st}$=0.57) are used to form the second emitting layer. The compound H1 in Formula 2 (92 wt. %) and the compound PD1 in Formula 4 (8 wt. %, $I_{2nd}/I_{1st}$=0.57) are used to form the third emitting layer, and the compound H1 in Formula 2 (60 wt. %), the compound TD1 in Formula 6 (39.8 wt. %) and the compound FD1 in Formula 8 (0.2 wt. %) were used to form the fourth emitting layer.

(6) Example 6 (Ex6)

The compound H1 in Formula 2 (92 wt. %) and the compound PD1 in Formula 4 (8 wt. %, $I_{2nd}/I_{1st}$=0.57) are used to form the first emitting layer, and the compound H1 in Formula 2 (60 wt. %), the compound TD1 in Formula 6 (39.8 wt. %) and the compound FD1 in Formula 8 (0.2 wt. %) are used to form the second emitting layer. The compound H1 in Formula 2 (60 wt. %), the compound TD1 in Formula 6 (39.8 wt. %) and the compound FD1 in Formula 8 (0.2 wt. %) are used to form the third emitting layer, and the compound H1 in Formula 2 (92 wt. %) and the compound PD1 in Formula 4 (8 wt. %, $I_{2nd}/I_{1st}$=0.57) were used to form the fourth emitting layer.

(7) Example 7 (Ex7)

The compound H1 in Formula 2 (60 wt. %), the compound TD1 in Formula 6 (39.8 wt. %) and the compound FD1 in Formula 8 (0.2 wt. %) are used to form the first emitting layer, and the compound H1 in Formula 2 (92 wt. %) and the compound PD1 in Formula 4 (8 wt. %, $I_{2nd}/I_{1st}$=0.57) are used to form the second emitting layer. The compound H1 in Formula 2 (60 wt. %), the compound TD1 in Formula 6 (39.8 wt. %) and the compound FD1 in Formula 8 (0.2 wt. %) are used to form the third emitting layer, and the compound H1 in Formula 2 (92 wt. %) and the compound PD1 in Formula 4 (8 wt. %, $I_{2nd}/I_{1st}$=0.57) were used to form the fourth emitting layer.

(8) Example 8 (Ex8)

The compound H1 in Formula 2 (92 wt. %) and the compound PD1 in Formula 4 (8 wt. %, $I_{2nd}/I_{1st}$=0.57) are used to form the first emitting layer, and the compound H1 in Formula 2 (60 wt. %), the compound TD1 in Formula 6 (39.8 wt. %) and the compound FD2 in Formula 8 (0.2 wt. %) are used to form the second emitting layer. The compound H1 in Formula 2 (92 wt. %) and the compound PD1 in Formula 4 (8 wt. %, $I_{2nd}/I_{1st}$=0.57) are used to form the third emitting layer, and the compound H1 in Formula 2 (60 wt. %), the compound TD1 in Formula 6 (39.8 wt. %) and the compound FD2 in Formula 8 (0.2 wt. %) are used to form the fourth emitting layer.

(9) Example 9 (Ex9)

The compound H1 in Formula 2 (92 wt. %) and the compound PD2 in Formula 4 (8 wt. %, $I_{2nd}/I_{1st}$=0.6) are used to form the first emitting layer, and the compound H1 in Formula 2 (60 wt. %), the compound TD1 in Formula 6 (39.8 wt. %) and the compound FD3 in Formula 8 (0.2 wt. %) are used to form the second emitting layer. The compound H1 in Formula 2 (92 wt. %) and the compound PD2 in Formula 4 (8 wt. %, $I_{2nd}/I_{1st}$=0.6) are used to form the third emitting layer, and the compound H1 in Formula 2 (60 wt. %), the compound TD1 in Formula 6 (39.8 wt. %) and the compound FD3 in Formula 8 (0.2 wt. %) are used to form the fourth emitting layer.

The emitting properties, i.e., the driving voltage (V), the luminance (cd/A), the color coordinate index (CIE), the maximum emission wavelength (ELmax) and the FWHM, of the OLED in Comparative Examples 1 to 7 and Examples 1 to 9 were measured and listed in Tables 1 and 2. In Tables 1 and 2, the measurement of Comparative Example 2, Examples 1 to 3, Example 8 and Example 9 marked with "*" is a simulation data.

TABLE 1

| | EML | V | cd/A | CIE | ELmax (nm) | FWHM (nm) |
|---|---|---|---|---|---|---|
| Reff | PD | 3.9 | 157 | (0.220, 0.735) | 530 | 25 |
| Ref2* | PD | — | 150 | (0.205, 0.737) | 528 | 25 |
| Ref3 | FD | 3.7 | 131 | (0.236, 0.727) | 532 | 23 |

TABLE 1-continued

| | EML | V | cd/A | CIE | ELmax (nm) | FWHM (nm) |
|---|---|---|---|---|---|---|
| Ref4 | FD | 3.7 | 127 | (0.236, 0.727) | 532 | 23 |
| Ref5 | FD | 3.7 | 125 | (0.219, 0.740) | 530 | 22 |
| Ref6 | FD/PD | 7.6 | 185 | (0.256, 0.713) | 534 | 26 |
| Ref7 | PD/FD | 7.6 | 189 | (0.227, 0.734) | 532 | 25 |

TABLE 2

| | EML | V | cd/A | CIE | ELmax (nm) | FWHM (nm) |
|---|---|---|---|---|---|---|
| Ex1* | PD:FD/PD:FD | — | 186 | (0.224, 0.736) | 530 | 20 |
| Ex2* | PD:FD/PD:FD | — | 189 | (0.224, 0.736) | 530 | 20 |
| Ex3* | PD:FD/PD:FD | — | 238 | (0.224, 0.736) | 530 | 20 |
| Ex4 | PD:FD/PD:FD | 7.5 | 234 | (0.224, 0.736) | 530 | 20 |
| Ex5 | FD:PD/PD:FD | 7.5 | 229 | (0.219, 0.740) | 530 | 22 |
| Ex6 | PD:FD/FD:PD | 7.5 | 225 | (0.236, 0.728) | 532 | 23 |
| Ex7 | FD:PD/FD:PD | 7.5 | 217 | (0.236, 0.727) | 532 | 23 |
| Ex8* | PD:FD/PD:FD | — | 229 | (0.224, 0.736) | 530 | 20 |
| Ex9* | PD:FD/PD:FD | — | 226 | (0.224, 0.736) | 530 | 20 |

As shown in Tables 1 and 2, in the OLED of Examples 1 to 9, where the first emitting part includes the fluorescent and phosphorescent emitting layers, i.e., the first and second emitting layers and the second emitting part includes the fluorescent and phosphorescent emitting layers, i.e., the third and fourth emitting layers, the emitting efficiency (luminance) is increased and the FWHM is decreased.

In addition, in comparison to the OLED of Examples 1 and 2, where the phosphorescent dopant has the ratio "$I_{2nd}/I_{1st}$" of the second emission peak intensity "$I_{2nd}$" to the first emission peak intensity "list" being 0.5 or less, the emitting efficiency of the OLED of Examples 3 to 9, where the phosphorescent dopant has the ratio "$I_{2nd}/I_{1st}$" of the second emission peak intensity "$I_{2nd}$" to the first emission peak intensity "list" being 0.55 or more, is significantly increased.

Moreover, in comparison to the OLED of Example 7, where the phosphorescent emitting layer is closer to the second electrode being the transparent electrode than the fluorescent emitting layer, the emitting efficiency and the lifespan of the OLED of Examples 3 to 6, where the fluorescent emitting layer in at least one of the first and second emitting parts is closer to the second electrode being the transparent electrode than the phosphorescent emitting layer, are significantly increased.

Furthermore, in comparison to the OLED of Example 6, where the fluorescent emitting layer in the first emitting part, which is closer to the first electrode being the reflective electrode, is closer to the second electrode being the transparent electrode than the phosphorescent emitting layer, the OLED of Example 5, where the fluorescent emitting layer in the second emitting part, which is closer to the second electrode being the transparent electrode, is closer to the second electrode being the transparent electrode than the phosphorescent emitting layer, has advantages in the emitting efficiency and the FWHM.

In addition, the emitting efficiency and the lifespan of the OLED of Example 4, where the fluorescent emitting layer in the first and second emitting parts is closer to the second electrode being the transparent electrode than the phosphorescent emitting layer, are further increased.

As illustrated above, the OLED of the present disclosure includes the first and second emitting parts, each of which includes the fluorescent emitting layer and the phosphorescent emitting layer, and the fluorescent emitting layer in at least one of the first and second emitting parts is disposed to be closer to the transparent electrode. As a result, the cavity effect is enhanced, and the property (performance) of the OLED is improved. Namely, the fluorescent emitting layer, which has a relatively small second emission peak intensity, is disposed to be closer to the transparent electrode such that the property (performance) of the OLED is improved.

In the OLED of the present disclosure, the phosphorescent emitting layer in the first emitting part, which is closer to the reflective electrode, can be disposed to be closer to the transparent electrode, and the fluorescent emitting layer in the second emitting part, which is closer to the transparent electrode, can be disposed to be closer to the transparent electrode.

In addition, in both the first emitting part, which is closer to the reflective electrode, and the second emitting part, which is closer to the transparent electrode, the fluorescent emitting layer can be disposed to be closer to the transparent electrode.

Moreover, the phosphorescent dopant in the phosphorescent emitting layer has the ratio "$I_{2nd}/I_{1st}$" of the second emission peak intensity "$I_{2nd}$" to the first emission peak intensity "$I_{1st}$" being 0.55 or more and 1 or less such that the emitting efficiency (luminance) of the OLED is significantly increased.

It will be apparent to those skilled in the art that various modifications and variations can be made in the present disclosure without departing from the spirit or scope of the present disclosure. Thus, it is intended that the present disclosure cover the modifications and variations of this disclosure provided they come within the scope of the appended claims and their equivalents.

What is claimed is:

1. An organic light emitting diode, comprising:

a reflective electrode;

a transparent electrode facing the reflective electrode; and an organic light emitting layer comprising a first emitting part and a second emitting part, wherein the first emitting part and the second emitting part are positioned between the reflective electrode and the transparent electrode, wherein the first emitting part comprises a first green phosphorescent emitting layer and a first green fluorescent emitting layer, and the second emitting part comprises a second green phosphorescent emitting layer and a second green fluorescent emitting layer, wherein the first green phosphorescent emitting layer comprises a first compound and a second compound, and the first green fluorescent emitting layer comprises a third compound, a fourth compound and a fifth compound, wherein the second green fluorescent emitting layer comprises a sixth compound, a seventh compound and an eighth compound, and the second green phosphorescent emitting layer comprises a ninth compound and a tenth compound, wherein each of the second compound and the tenth compound is represented by Formula 3:

[Formula 3]

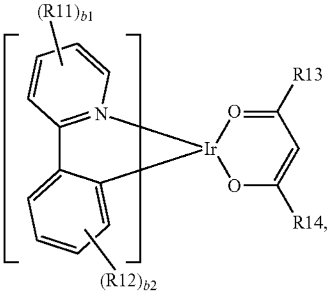

wherein in Formula 3, each of R11 and R12 is independently selected from the group consisting of halogen, a substituted or unsubstituted C1 to C10 alkyl group, a substituted or unsubstituted C6 to C30 aryl group and a substituted or unsubstituted C5 to C30 heteroaryl group, and each of b1 and b2 is independently an integer of 0 to 4, wherein each of R13 and R14 is independently selected from the group consisting of hydrogen, halogen, a substituted or unsubstituted C1 to C10 alkyl group, a substituted or unsubstituted C6 to C30 aryl group and a substituted or unsubstituted C5 to C30 heteroaryl group, wherein each of the fifth compound and the eighth compound is represented by Formula 7:

[Formula 7]

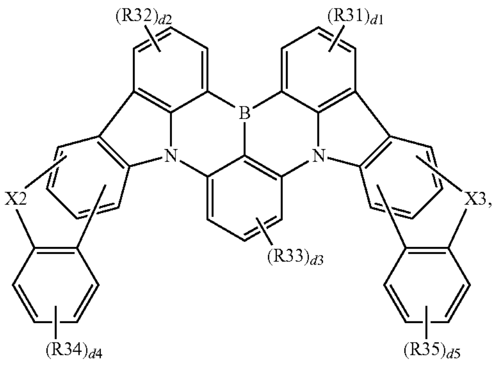

wherein in Formula 7, each of d1, d2 and d3 is independently an integer of 0 to 3, and each of d4 and d5 is independently an integer of 0 to 4, wherein each of R31, R32, R33, R34 and R35 is independently selected from the group consisting of halogen, cyano, a substituted or unsubstituted C1 to C10 alkyl group, a substituted or unsubstituted C6 to C30 aryl group and a substituted or unsubstituted C5 to C30 heteroaryl group, or at least one of two adjacent R31 when d1 is an integer of 2 or more, two adjacent R32 when d2 is an integer of 2 or more, two adjacent R33 when d3 is an integer of 2 or more, two adjacent R34 when d4 is an integer of 2 or more and two adjacent R35 when d5 is an integer of 2 or more is connected to each other to form an aromatic ring or a heteroaromatic ring, and wherein each of X2 and X3 is independently selected from NR36, O and S, and R36 is selected from the group consisting of hydrogen, a substituted or unsubstituted C1 to C10 alkyl group, a substituted or unsubstituted C6 to C30 aryl group and a substituted or unsubstituted C5 to C30 heteroaryl group.

2. The organic light emitting diode according to claim 1, wherein in Formula 3, each of R11, R12, R13 and R14 is independently a substituted or unsubstituted C1 to C10 alkyl group selected from methyl, ethyl, n-propyl, isopropyl, n-butyl, sec-butyl, isobutyl, tert-butyl, pentyl, isopentyl, sec-pentyl, hexyl, heptyl, octyl, nonyl and decyl.

3. The organic light emitting diode according to claim 1, wherein each of the second compound and the tenth compound is independently one of compounds in Formula 4:

[Formula 4]

PD1

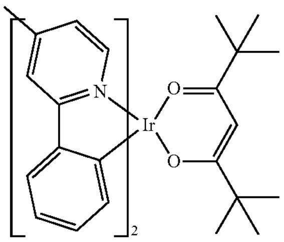

PD2

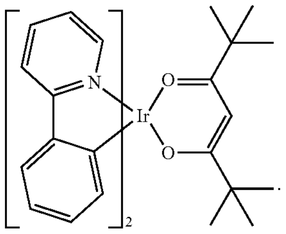

4. The organic light emitting diode according to claim 1, wherein in Formula 7, each of d1, d2 and d3 is independently an integer of 0 or 1, each of d4 and d5 is independently an integer of 0 or 1, each of R31, R32, R33, R34 and R35 is independently a substituted or unsubstituted C1 to C10 alkyl group, a substituted or unsubstituted carbazole, a substituted or unsubstituted phenyl group, and each of X2 and X3 is independently NR36, where R36 is selected from the group consisting of hydrogen, a substituted or unsubstituted C1 to C10 alkyl group, and a substituted or unsubstituted phenyl group.

5. The organic light emitting diode according to claim 1, wherein each of the fifth compound and the eighth compound is independently one of compounds in Formula 8:

[Formula 8]
FD1
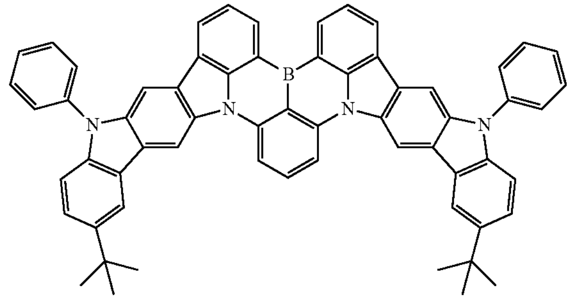
FD2
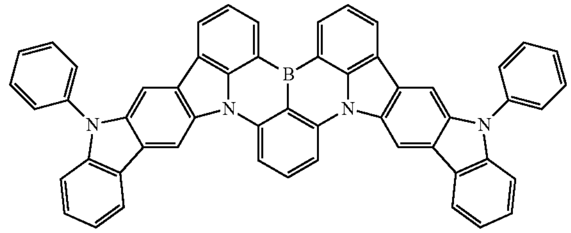
FD3
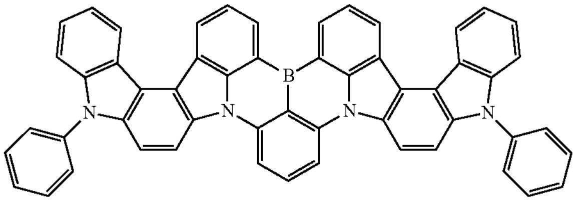
FD4
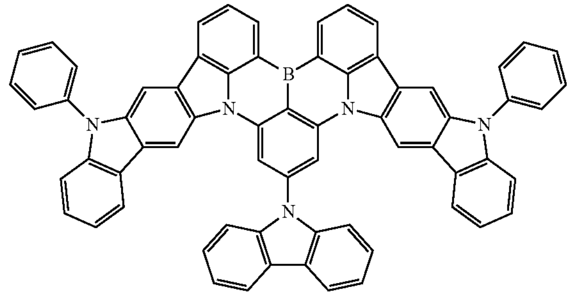
FD5
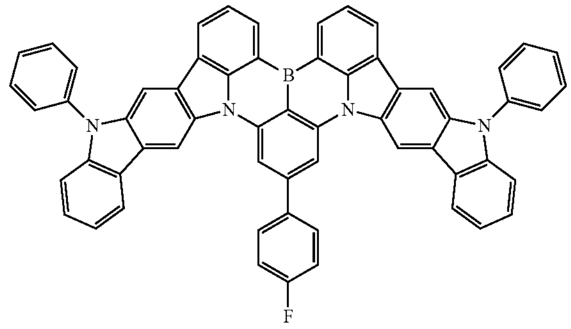
-continued
FD6
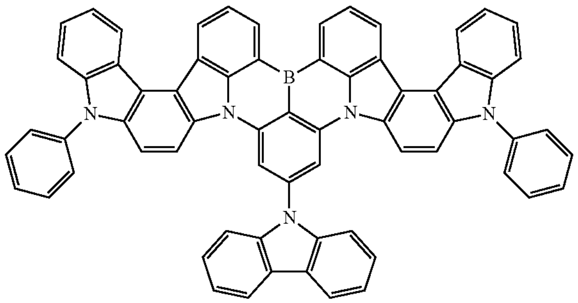
FD7
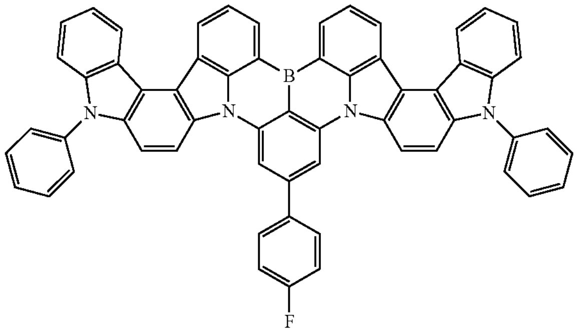
FD8
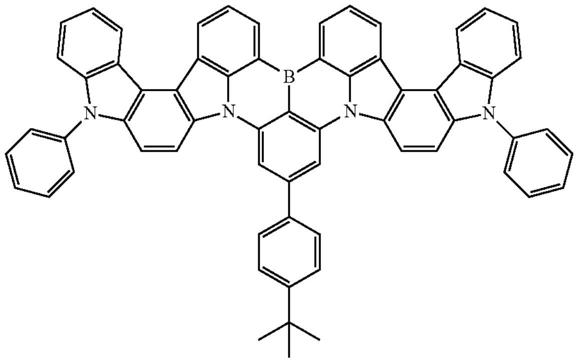
FD9
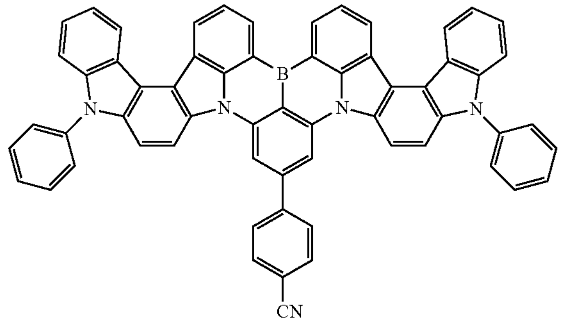
.
6. The organic light emitting diode according to claim 1, wherein each of the first compound, the third compound, the sixth compound and the ninth compound is independently represented by Formula 1-1:

[Formula 1-1]

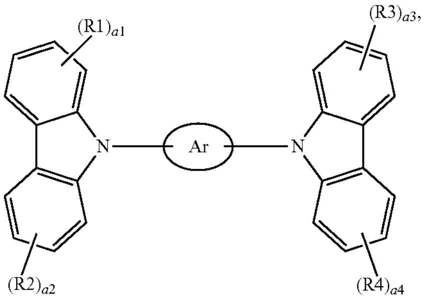

wherein in Formula 1-1, Ar is selected from the group consisting of a substituted or unsubstituted C6 to C30 arylene group and a substituted or unsubstituted C5 to C30 heteroarylene group, and each of R1, R2, R3 and R4 is independently selected from the group consisting of a substituted or unsubstituted C1 to C10 alkyl group and a substituted or unsubstituted C6 to C30 aryl group, and wherein each of a1, a2, a3 and a4 is independently an integer from 0 to 4.

7. The organic light emitting diode according to claim 6, wherein Formula 1-1 is represented by Formula 1-2:

[Formula 1-2]

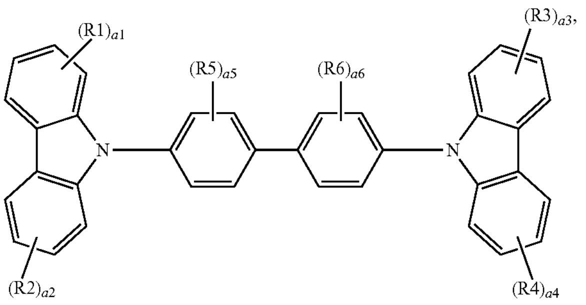

wherein in Formula 1-2, each of R1, R2, R3 and R4 is independently selected from the group consisting of a substituted or unsubstituted C1 to C10 alkyl group and a substituted or unsubstituted C6 to C30 aryl group, each of a1, a2, a3 and a4 is independently an integer from 0 to 4, and each of R5 and R6 is independently selected from the group consisting of a substituted or unsubstituted C1 to C10 alkyl group and a substituted or unsubstituted C6 to C30 aryl group, and each of a5 and a6 is independently an integer of 0 to 4.

8. The organic light emitting diode according to claim 6, wherein each of the first compound, the third compound, the sixth compound and the ninth compound is independently one of compounds in Formula 2:

[Formula 2]

H1

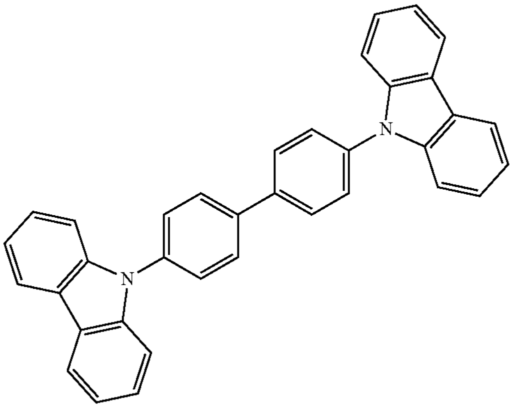

H2

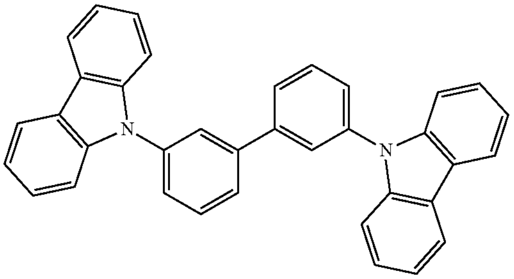

H3

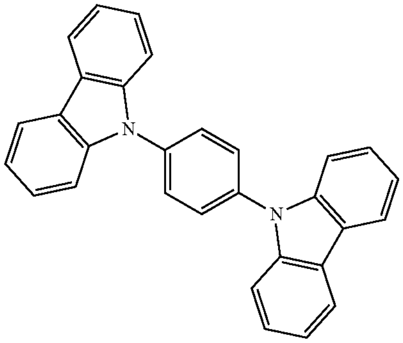

H4

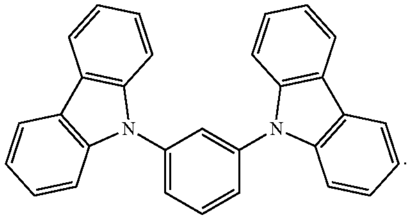

9. The organic light emitting diode according to claim 1, wherein each of the fourth compound and the seventh compound is represented by Formula 5:

[Formula 5]

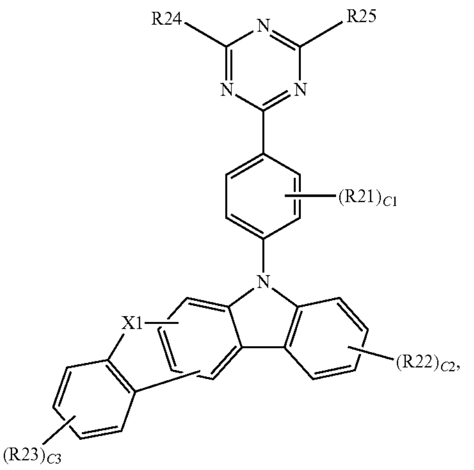

wherein in Formula 5, each of R21, R22 and R23 is independently selected from the group consisting of halogen, cyano, a substituted or unsubstituted C1 to C10 alkyl group, a substituted or unsubstituted C6 to C30 aryl group and a substituted or unsubstituted C5 to C30 heteroaryl group, and each of c1, c2, and c3 is independently an integer of 0 to 4, wherein X1 is selected from NR26, O and S, and each of R24, R25 and R26 is independently selected from the group consisting of hydrogen, a substituted or unsubstituted C1 to C10 alkyl group, a substituted or unsubstituted C6 to C30 aryl group and a substituted or unsubstituted C5 to C30 heteroaryl group.

10. The organic light emitting diode according to claim 9, wherein in Formula 5, each of c1, c2, and c3 is zero, wherein X1 is selected from NR26, O and S, and each of R24, R25 and R26 is independently selected from the group consisting of a substituted or unsubstituted C1 to C10 alkyl group, and a substituted or unsubstituted phenyl group.

11. The organic light emitting diode according to claim 9, wherein each of the fourth compound and the seventh compound is independently one of compounds in Formula 6:

[Formula 6]

TD1

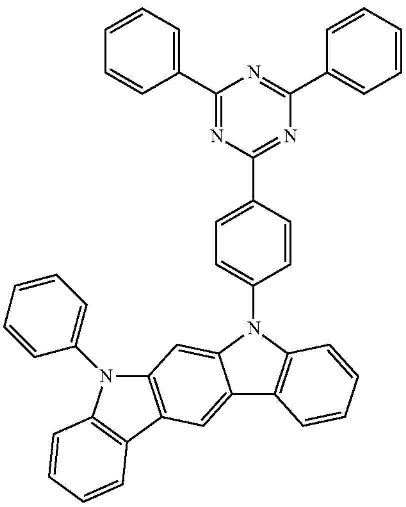

-continued

TD2

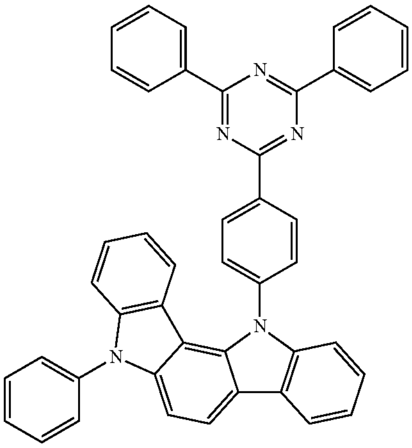

TD3

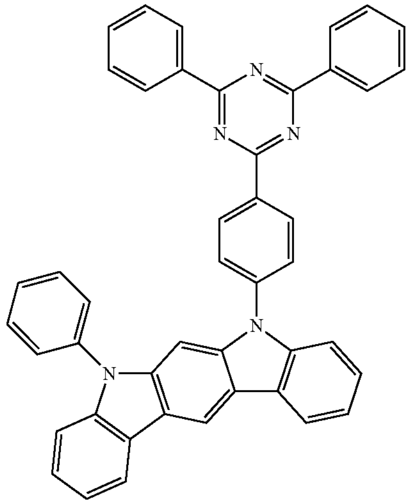

TD4

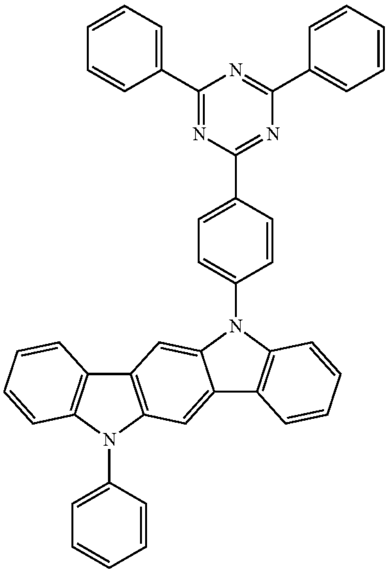

-continued
TD5
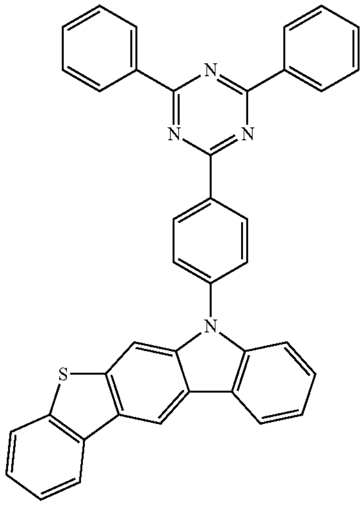
TD6
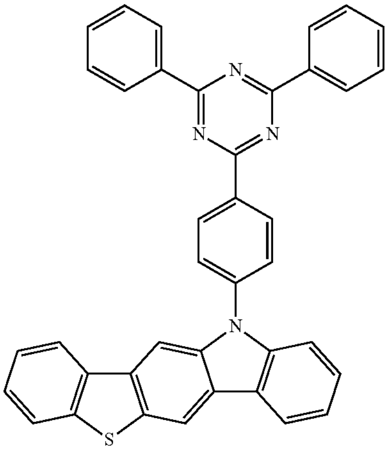
TD7
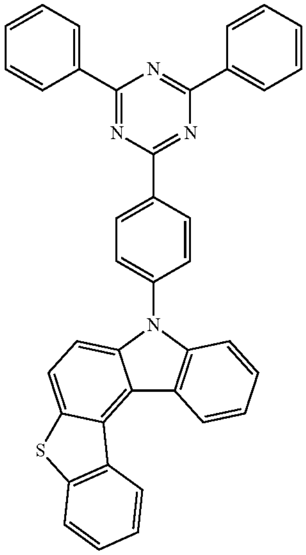
-continued
TD8
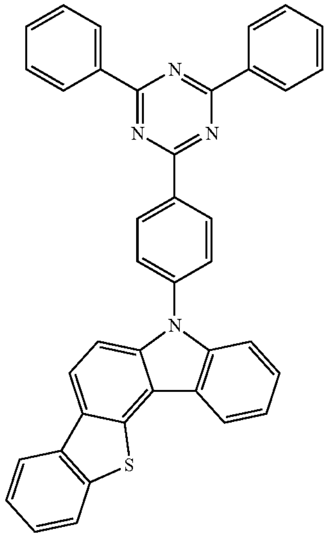
TD9
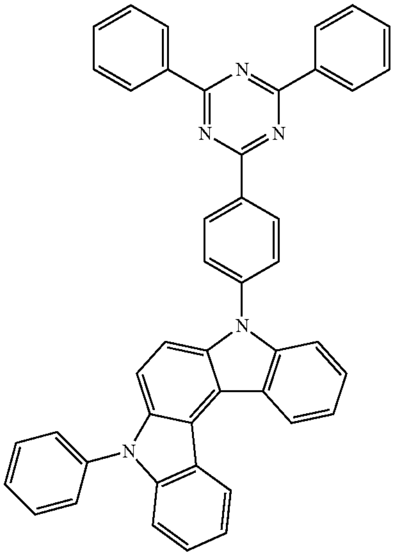
TD10
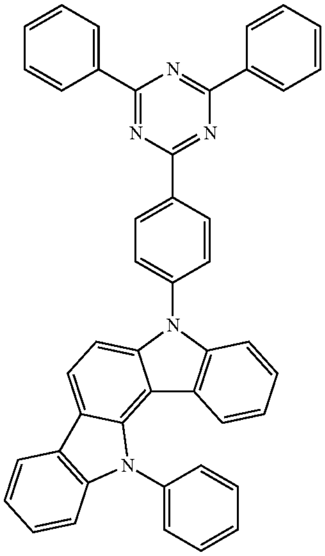

-continued

TD11

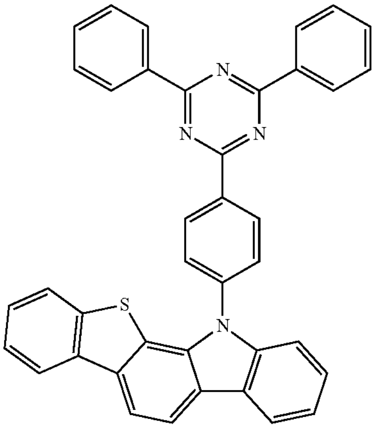

TD12

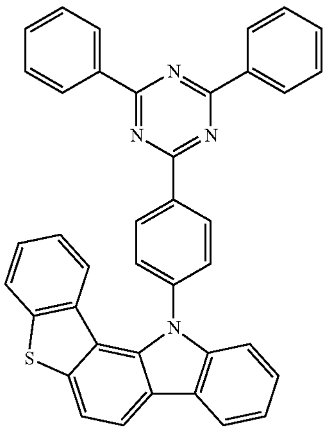

TD13

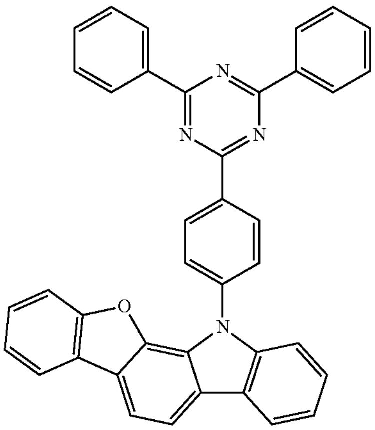

-continued

TD14

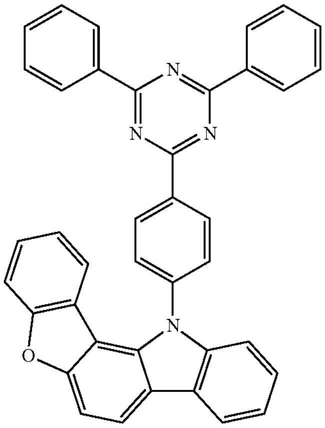

TD15

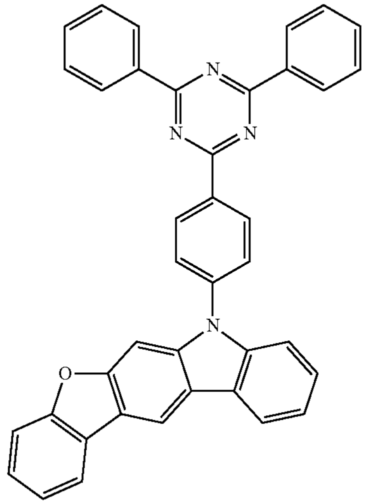

TD16

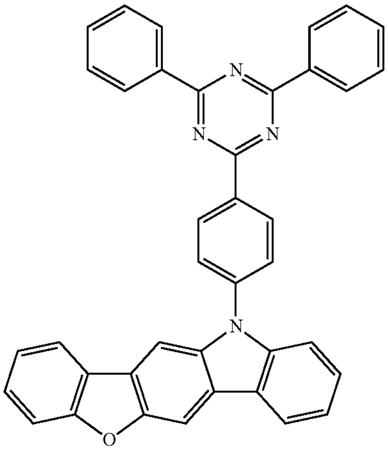

12. The organic light emitting diode according to claim 1, wherein an intensity of a second emission peak of the first green fluorescent emitting layer is smaller than an intensity of a second emission peak of the first green phosphorescent emitting layer, and wherein an intensity of a second emission peak of the second green fluorescent emitting layer is smaller than an intensity of a second emission peak of the second green phosphorescent emitting layer.

13. The organic light emitting diode according to claim 1, wherein in the second compound, a ratio of an intensity of a second emission peak to an intensity of a first emission peak is 0.55 or more and 1 or less.

14. The organic light emitting diode according to claim 1, wherein (i) the second emitting part is positioned between the first emitting part and the transparent electrode, and wherein the second green fluorescent emitting layer is positioned to be closer to the transparent electrode than the second green phosphorescent emitting layer, (ii) the first green fluorescent emitting layer is positioned to be closer to the transparent electrode than the first green phosphorescent emitting layer, or (iii) the first green phosphorescent emitting layer is positioned to be closer to the transparent electrode than the first green fluorescent emitting layer.

15. An organic light emitting display device, comprising:

a substrate comprising a red pixel region, a green pixel region and a blue pixel region; and the organic light emitting diode according to claim 1 disposed on the substrate and in the green pixel region.

16. The organic light emitting display device according to claim 15, wherein each of the first compound, the third compound, the sixth compound and the ninth compound is represented by Formula 1-1:

[Formula 1-1]

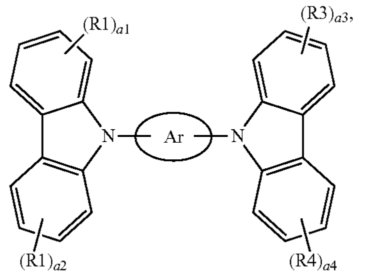

wherein in Formula 1-1, Ar is selected from the group consisting of a substituted or unsubstituted C6 to C30 arylene group and a substituted or unsubstituted C5 to C30 heteroarylene group, and each of R1, R2, R3 and R4 is independently selected from the group consisting of a substituted or unsubstituted C1 to C10 alkyl group and a substituted or unsubstituted C6 to C30 aryl group, and wherein each of a1, a2, a3 and a4 is independently an integer from 0 to 4.

17. The organic light emitting display device according to claim 15, wherein each of the fourth compound and the seventh compound is represented by Formula 5:

[Formula 5]

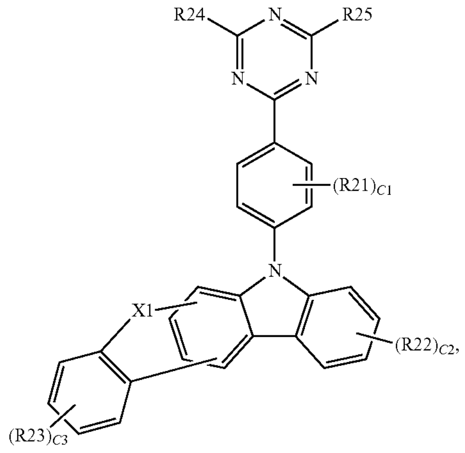

wherein in Formula 5, each of R21, R22 and R23 is independently selected from the group consisting of halogen, cyano, a substituted or unsubstituted C1 to C10 alkyl group, a substituted or unsubstituted C6 to C30 aryl group and a substituted or unsubstituted C5 to C30 heteroaryl group, and each of c1, c2, and c3 is independently an integer of 0 to 4, wherein X1 is selected from NR26, O and S, and each of R24, R25 and R26 is independently selected from the group consisting of hydrogen, a substituted or unsubstituted C1 to C10 alkyl group, a substituted or unsubstituted C6 to C30 aryl group and a substituted or unsubstituted C5 to C30 heteroaryl group.

18. The organic light emitting display device according to claim 15, wherein an intensity of a second emission peak of the first green fluorescent emitting layer is smaller than an intensity of a second emission peak of the first green phosphorescent emitting layer, and wherein an intensity of a second emission peak of the second green fluorescent emitting layer is smaller than an intensity of a second emission peak of the second green phosphorescent emitting layer.

19. The organic light emitting display device according to claim 15, wherein in the second compound, a ratio of an intensity of a second emission peak to an intensity of a first emission peak is 0.55 or more and 1 or less.

20. The organic light emitting device according to claim 15, wherein (i) the second emitting part is positioned between the first emitting part and the transparent electrode, and wherein the second green fluorescent emitting layer is positioned to be closer to the transparent electrode than the second green phosphorescent emitting layer, (ii) the first green fluorescent emitting layer is positioned to be closer to the transparent electrode than the first green phosphorescent emitting layer, or (iii) the first green phosphorescent emitting layer is positioned to be closer to the transparent electrode than the first green fluorescent emitting layer.

21. An organic light emitting diode, comprising:

a reflective electrode;

a transparent electrode facing the reflective electrode; and an organic light emitting layer comprising a first emitting part and a second emitting part, wherein the first emitting part and the second emitting part are positioned between the reflective electrode and the transparent electrode, wherein the first emitting part comprises a first phosphorescent emitting layer and a first fluorescent emitting layer, and the second emitting part comprises a second phosphorescent emitting layer and a second fluorescent emitting layer, wherein the first phosphorescent emitting layer comprises a first compound and a second compound, and the first fluorescent emitting layer comprises a third compound, a fourth compound and a fifth compound, wherein the second fluorescent emitting layer comprises a sixth compound, a seventh compound and an eighth compound, and the second phosphorescent emitting layer comprises a ninth compound and a tenth compound, wherein each of the second compound and the tenth compound is represented by Formula 3:

[Formula 3]

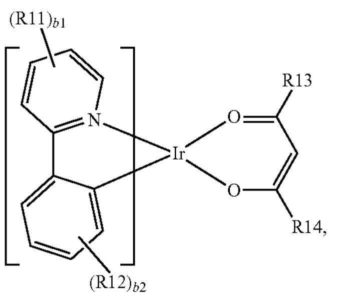

wherein in Formula 3, each of R11, R12, R13 and R14 is independently a substituted or unsubstituted C1 to C10 alkyl group selected from methyl, ethyl, n-propyl, isopropyl, n-butyl, sec-butyl, isobutyl, tert-butyl, pentyl, isopentyl, sec-pentyl, hexyl, heptyl, octyl, nonyl and decyl, and each of b1 and b2 is independently an integer of 0 to 4, wherein each of the fifth compound and the eighth compound is represented by Formula 7:

[Formula 7]

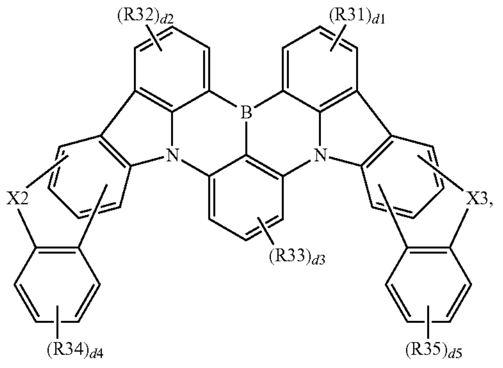

wherein in Formula 7, each of d1, d2 and d3 is independently an integer of 0 or 1, each of d4 and d5 is independently an integer of 0 or 1, each of R31, R32, R33, R34 and R35 is independently a substituted or unsubstituted C1 to C10 alkyl group, a substituted or unsubstituted carbazole, a substituted or unsubstituted phenyl group, each of X2 and X3 is independently NR36, where R36 is selected from the group consisting of hydrogen, a substituted or unsubstituted C1 to C10 alkyl group, and a substituted or unsubstituted phenyl group, wherein an intensity of a second emission peak of the second fluorescent emitting layer is smaller than an intensity of a second emission peak of the second phosphorescent emitting layer, wherein the second emitting part is positioned between the first emitting part and the transparent electrode, and wherein the second fluorescent emitting layer is positioned to be closer to the transparent electrode than the second phosphorescent emitting layer.

22. The organic light emitting diode according to claim 21, wherein each of the first compound, the third compound, the sixth compound and the ninth compound is independently represented by Formula 1-1:

[Formula 1-1]

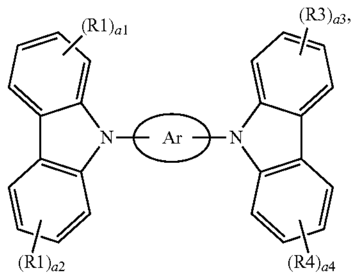

wherein in Formula 1-1, Ar is selected from the group consisting of a substituted or unsubstituted C6 to C30 arylene group and a substituted or unsubstituted C5 to C30 heteroarylene group, and each of R1, R2, R3 and R4 is independently selected from the group consisting of a substituted or unsubstituted C1 to C10 alkyl group and a substituted or unsubstituted C6 to C30 aryl group, and wherein each of a1, a2, a3 and a4 is independently an integer from 0 to 4;

wherein each of the fourth compound and the seventh compound is represented by Formula 5:

[Formula 5]

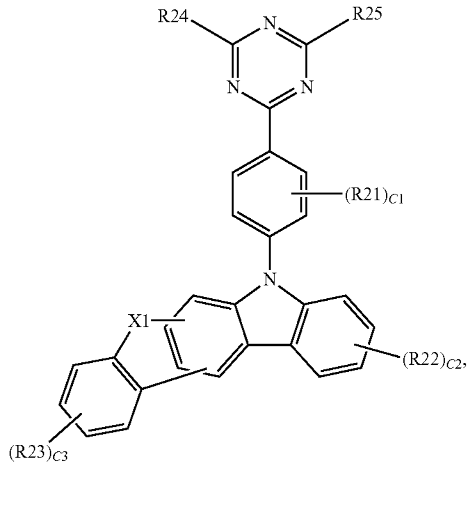

wherein in Formula 5, each of R21, R22 and R23 is independently selected from the group consisting of halogen, cyano, a substituted or unsubstituted C1 to C10 alkyl group, a substituted or unsubstituted C6 to C30 aryl group and a substituted or unsubstituted C5 to C30 heteroaryl group, and each of c1, c2, and c3 is independently an integer of 0 to 4, wherein X1 is selected from NR26, O and S, and each of R24, R25 and R26 is independently selected from the group consisting of hydrogen, a substituted or unsubstituted C1 to C10 alkyl group, a substituted or unsubstituted C6 to C30 aryl group and a substituted or unsubstituted C5 to C30 heteroaryl group.

23. The organic light emitting diode according to claim 21, wherein each of the first phosphorescent emitting layer, the first fluorescent emitting layer, the second phosphorescent emitting layer and the second fluorescent emitting layer is a green emitting layer.

* * * * *